(12) United States Patent
Ishii et al.

(10) Patent No.: US 7,839,461 B2
(45) Date of Patent: Nov. 23, 2010

(54) ELECTRO-OPTICAL DEVICE SUBSTRATE, METHOD OF MANUFACTURING THE SAME, ELECTRO-OPTICAL DEVICE AND ELECTRONIC APPARATUS

(75) Inventors: Tatsuya Ishii, Chitose (JP); Minoru Moriwaki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 260 days.

(21) Appl. No.: 12/031,035

(22) Filed: Feb. 14, 2008

(65) Prior Publication Data

US 2008/0197355 A1    Aug. 21, 2008

(30) Foreign Application Priority Data

Feb. 16, 2007    (JP) ............... 2007-036346

(51) Int. Cl.
*G02F 1/136* (2006.01)
(52) U.S. Cl. ............... 349/43; 349/19; 349/33; 349/41; 349/42; 349/46
(58) Field of Classification Search ............ 349/19, 349/33, 41, 42, 43, 46
See application file for complete search history.

(56) References Cited

U.S. PATENT DOCUMENTS

| 7,633,164 B2 * | 12/2009 | Koike et al. ............... 257/762 |
| 2001/0038976 A1 * | 11/2001 | Tanabe et al. ............ 430/325 |
| 2008/0186423 A1 * | 8/2008 | Ishii ....................... 349/46 |

FOREIGN PATENT DOCUMENTS

| JP | 2003-262888 | 9/2003 |
| JP | 2004-004722 | 1/2004 |
| JP | 3731447 | 10/2005 |

\* cited by examiner

*Primary Examiner*—Jennifer Doan
(74) *Attorney, Agent, or Firm*—Workman Nydegger

(57) ABSTRACT

An electro-optical device that includes a transistor and an insulating film over the semiconductor layer of the transistor. The insulating film has an opening portion that overlaps the channel region. The gate electrode of the transistor includes a body portion arranged in the opening portion of the insulating film and an elongated portion that extends onto the insulating film so as to cover the second junction portion of the transistor. The second junction region is located in an intersection region of a non-aperture region of the display pixel.

10 Claims, 14 Drawing Sheets

ELECTRO-OPTICAL DEVICE SUBSTRATE, METHOD OF MANUFACTURING THE SAME, ELECTRO-OPTICAL DEVICE AND ELECTRONIC APPARATUS

BACKGROUND

1. Technical Field

The present invention relates to a technical field of, for example, an electro-optical device substrate and a method of manufacturing the same, used for an electro-optical device such as a liquid crystal device, an electro-optical device provided with the electro-optical device substrate, and an electronic apparatus, such as a liquid crystal projector, for example, provided with the electro-optical device.

2. Related Art

A liquid crystal device, which is an example of the above electro-optical device, is not only used for a direct view type display but also used widely, for example, as a light modulating device (light valve) of a projection-type display device. Particularly, when in a projection-type display device, because intensive light emitted from a light source enters a liquid light valve, a light shielding film, which serves as a light shielding device that blocks incident light, is installed in the liquid light valve so that a thin-film transistor (TFT) in the liquid light valve does not cause an increase in leakage current and/or a malfunction, or the like, because of the intensive light. In regard to the above light shielding device or the light shielding film, Japanese Unexamined Patent Application Publication No. 2004-4722 describes a technology for blocking light using a scanning line, which serves as a gate electrode, in a channel region of a TFT. Japanese Patent No. 3731447 describes that light that reaches a channel region of a TFT is reduced by providing a plurality of light shielding films formed on the channel region and a layer that absorbs internally reflected light. Japanese Unexamined Patent Application Publication No. 2003-262888 describes a technology for reducing incident light that enters a channel region of a TFT as much as possible while making it possible to ensure an appropriate operation of the TFT and to reduce the width of a scanning line.

However, when light is irradiated to a junction region, such as an LDD (Lightly Doped Drain) region, for example, formed between a channel region and a source/drain region, there is a problem that light leakage current may occur in the junction region. To deal with the above problem, it is conceivable that a light shielding device is provided on or above junction regions on both sides of the channel region, but, in view of display performance, it is undesirable to reduce an aperture region in each pixel through which light is substantially transmitted. On one hand, the inventors of this application have estimated that light leakage current tends to occur in the TFT more easily when light is irradiated to a junction region formed between a source/drain region, connected to a pixel electrode, and the channel region than when light is irradiated to a junction region formed between a source/drain region, connected to a data line, and the channel region.

On the other hand, in an electro-optical device of this type, there is a need for miniaturization of pixels in order to implement a small-sized device and a high-definition display image.

SUMMARY

An advantage of some aspects of the invention is that, for example, in an electro-optical device, such as an active matrix addressing liquid crystal device, it provides an electro-optical device substrate and a method of manufacturing the same, used for an electro-optical device that is able to realize a high aperture ratio while making it possible to effectively reduce the occurrence of light leakage current in a TFT and to implement a high-definition display image, an electro-optical device that is provided with the electro-optical device substrate, and an electronic apparatus.

An aspect of the invention provides an electro-optical device substrate. The electro-optical device substrate includes, on a substrate, a plurality of data lines, a plurality of scanning lines, pixel electrodes, and transistors. The plurality of data lines and the plurality of scanning lines extend so as to intersect with each other. The pixel electrodes are provided in pixels defined at positions corresponding to intersections of the data lines and the scanning lines. Each of the transistors includes a semiconductor layer and a gate electrode. The semiconductor layer includes a channel region, a data line side source/drain region, a pixel electrode side source/drain region, a first junction region and a second junction region. The channel region is located in a first region, extending along a first direction, within a non-aperture region that separates aperture regions of the pixels and has a channel length along the first direction. The data line side source/drain region is electrically connected to a corresponding one of the data lines. The pixel electrode side source/drain region is electrically connected to a corresponding one of the pixel electrodes. The first junction region is formed between the channel region and the data line side source/drain region. The second junction region is formed between the channel region and the pixel electrode side source/drain region. The gate electrode includes a body portion and an elongated portion. The body portion is arranged in an opening portion that is opened at a portion of an insulating film, which overlaps the channel region, the insulating film being arranged so as to cover the semiconductor layer, and is opposed to the channel region through a gate insulating film. The elongated portion extends from the body portion onto the insulating film so as to cover the second junction region. The second junction region is located, within the non-aperture region, in an intersection region at which a second region, which extends along a second direction that intersects with the first direction, and the first region intersect with each other.

According to an electro-optical device that is provided with the electro-optical device substrate of the aspect of the invention, while the electro-optical device is operating, for example, in the electro-optical device substrate, supply of image signals from the data lines to the pixel electrodes are controlled, so that an image may be displayed by means of so-called active matrix addressing. Note that an image signal is supplied to the pixel electrode from a corresponding one of the data lines through the transistor at predetermined timing in such a manner that the transistor, which is a switching element electrically connected between the data line and the pixel electrode, is turned on/off in accordance with a scanning signal supplied from a corresponding one of the scanning lines. The pixel electrode is a transparent electrode that is, for example, formed of a transparent conductive material, such as ITO (Indium Tin Oxide). The plurality of pixel electrodes are provided in a matrix in an area, which becomes a display area, on the substrate at positions corresponding to intersections of the data lines and the scanning lines.

Here, the scanning lines, the data lines and the transistors are provided not in the aperture regions of the pixels but in the non-aperture region so as not to hinder display.

Here, the "aperture region" according to the aspects of the invention is a region, such as a region through which light that actually contributes to display in each pixel is emitted, in which an electro-optical operation is actually performed by an electro-optical element or an electro-optical material in each pixel. The "non-aperture region" according to the aspects of the invention is a region that separates the aperture regions of the pixels, and is a region, such as a region through which no light that contributes to display in each pixel is emitted, in which, in each pixel, no electro-optical operation is actually performed by an electro-optical element or an electro-optical material. The non-aperture region is, for example, formed of a light shielding film, such as a data line or a scanning line, which at least partly has a light shielding property. The non-aperture region is defined on the substrate so as to surround the aperture regions, and serves as a region that is able to block light that will enter each pixel by the light shielding film. Alternatively, a non-aperture region may be defined by a light shielding film that has a light shielding property, formed not only on the electro-optical device substrate but also on another substrate that is opposed to the electro-optical device substrate to hold an electro-optical material, for example, liquid crystal, in an electro-optical device.

In the aspect of the invention, the non-aperture region includes, on the substrate, the first region extending along the first direction and the second region extending along the second direction that intersects with the first direction. The "first direction" according to the aspect of the invention means, for example, a direction of rows of a plurality of pixels defined in a matrix on the substrate, that is, an array direction in which the plurality of data lines are arranged or a direction in which the plurality of scanning lines extend (for example, in an X direction indicated in the drawings, which will be described later) or a direction of columns of the plurality of pixels defined in a matrix on the substrate, that is, an array direction in which the plurality of scanning lines are arranged or a direction in which the plurality of data lines extend (for example, in a Y direction indicated in the drawings, which will be described later).

Each of the transistors includes the semiconductor layer and the gate electrode. The semiconductor layer has the channel region.

The semiconductor layer includes the channel region, the data line side source/drain region, the pixel electrode side source/drain region, the first junction region and the second junction region. The channel region is located in the first region, extending along the first direction, within the non-aperture region that separates the aperture regions of the plurality of pixels and has a channel length along the first direction. The data line side source/drain region is electrically connected to a corresponding one of the data lines. The pixel electrode side source/drain region is electrically connected to a corresponding one of the pixel electrodes. The first junction region is formed between the channel region and the data line side source/drain region. The second junction region is formed between the channel region and the pixel electrode side source/drain region. That is, each of the transistors has an LDD structure. Here, the first junction region is a region that is formed at a junction between the channel region and the data line side source/drain region. The second junction region is a region that is formed at a junction between the channel region and the pixel electrode side source/drain region. That is, the first junction region and the second junction region mean, for example, a PN junction region when a transistor is, for example, formed as an NPN type or a PNP type transistor (that is, an N channel type or a P channel type transistor), or an LDD region (that is, an impurity region formed by implanting impurities into the semiconductor layer by means of ion implantation, for example) when the transistor has an LDD structure.

In the aspect of the invention, each of the gate electrodes is formed to include the body portion and the elongated portion. The elongated portion is formed in an upper layer on the semiconductor layer through the insulating film and is formed integrally with the body portion. The body portion is a portion that substantially functions as the gate electrode of the transistor while the transistor is operating. The insulating film has the opening portion that is opened at a portion that overlaps the channel region in plan view on the substrate, and the body portion is formed in the opening portion so as to overlap the channel region through the gate insulating film. In addition, the elongated portion is formed in an upper layer through the insulating film on the semiconductor layer so as to overlap the second junction region in plan view on the substrate. Thus, owing to the elongated portion, it is possible to block light that will enter the second junction region from an upper layer thereof. Moreover, the elongated portion is arranged immediately above the second junction region through the insulating film, so that it is possible to further reliably reduce light that travels toward a lower layer than the elongated portion, passes through the insulating film and enters the second junction region.

Note that the elongated portion may be formed along the same direction in which the semiconductor layer extends, that is, along the first direction, or may be formed the direction that intersects with the direction in which the semiconductor layer extends, that is, the second direction.

Furthermore, in the aspect of the invention, particularly, the second junction region is arranged in the intersection region of the non-aperture region, at which the first region and the second region intersect with each other. Thus, among rays of light that will enter the second junction region from an upper layer thereof, light that has a component to travel along the first direction may be blocked by, for example, the scanning line, or the like, provided in the first region, and light that has a component to travel along the second direction may be blocked by, for example, the data line, or the like, provided in the second region.

Thus, it is possible to block light that travels toward the second junction region by, for example, the scanning line provided in the first region or the data line provided in the second region, or the like, in addition to the elongated portion formed to cover the second junction region. That is, it is possible to further reliably reduce light that will enter the second junction region. In this manner, a light shielding property pinpoint to the second junction region among various regions formed in the semiconductor layer may be enhanced. As a result, it is possible to effectively reduce light leakage current of the transistor in each pixel.

Moreover, in the aspect of the invention, even when an additional light shielding portion that shields the second junction region against light is not provided in addition to the intersection region, it is possible to enhance a light shielding property pinpoint to the second junction region. Thus, by providing a light shielding portion that enhances a pinpoint light shielding property, an area of arrangement for the non-aperture region of the pixels is increased, and it is possible to prevent the aperture regions from being reduced. As a result, even when the pixels are miniaturized, it is possible to improve the pinpoint light shielding property and to further improve the aperture ratio. Note that the "aperture ratio" means a ratio of an aperture region to the size of a pixel that includes the aperture region and a non-aperture region. As the aperture ratio increases, display performance of the device improves.

In addition, the elongated portion is formed in an upper layer than the second junction region through the insulating film, and is electrically insulated from the second junction region. Thus, while the transistor is operating, it is possible to prevent the occurrence of malfunction in the transistor because of an electrical influence given to the second junction region by electric field that is generated in the elongated portion formed integrally with the body portion that substantially functions as a gate electrode.

Furthermore, the elongated portion and the body portion are arranged at positions different from each other in a vertical direction on the substrate, but they are formed integrally with each other. Thus, because these elongated portion and body portion are arranged at positions different in height from each other, in comparison with the case where an elongated portion and a body portion are formed separately in a pattern, it is possible to prevent troubles, such as interruption of electrical connection between the elongated portion and the body portion or a short circuit of the elongated portion to the second junction region, even when pixels are miniaturized. Accordingly, it is possible to prevent the occurrence of malfunction in the transistor because of a trouble related to such an electrical connection.

Thus, according to the electro-optical device substrate of the aspect of the invention as described above, it is possible to reduce or prevent the occurrence of display defects, such as a flicker, because of the occurrence of light leakage current of the transistor in each pixel. Furthermore, it is possible to easily miniaturize the pixels while preventing malfunction of the transistor and/or a decrease in aperture ratio. Thus, according to the electro-optical device substrate of the aspect of the invention, it is possible to achieve a high-quality image display.

In one aspect of the electro-optical device substrate according to the invention, at least a portion of the channel region may be arranged in the first region outside the intersection region.

According to this aspect, the channel region of the semiconductor layer is entirely or partly arranged in the first region outside the intersection region. That is, the channel region is entirely arranged outside the intersection region or is arranged in a region that includes a portion of the intersection region and a region extends from the portion of the intersection region outside the intersection region. Thus, the body portion of the gate electrode, which overlaps the channel region in the opening portion, is at least partly arranged outside the intersection region, and the elongated portion is at least partly arranged in the intersection region. In this manner, by integrally forming the body portion and the elongated portion that are arranged in the first region at positions different from each other, it is possible to easily form the gate electrode. Hence, because, on the substrate, the intersection region may be formed with a necessary minimum area of arrangement required for arranging the second junction region, it is possible to easily miniaturize the pixels while improving the aperture ratio.

In another aspect of the electro-optical device substrate of the invention, each of the scanning lines may be integrally formed with the corresponding elongated portion with the same film in the same layer.

According to this aspect, in a manufacturing process of the electro-optical device substrate, in the gate electrode, at least the elongated portion and the scanning line can be formed in the same process with the same film at the same time, so that it is possible to further simplify the manufacturing process.

In yet another aspect of the electro-optical device substrate of the invention, each of the elongated portions may be formed in the intersection region so as to overlap the corresponding data line.

According to this aspect, owing to the data line and the elongated portion, it is possible to block light that will enter the second junction region in the intersection region from an upper layer thereof. Thus, it is possible to further reliably reduce light that will enter the second junction region. As a result, it is possible to further effectively enhance a light shielding property pinpoint to the second junction region.

In yet another aspect of the electro-optical device substrate of the invention, a protection film may be provided in an upper layer than the semiconductor layer and in a lower layer than the insulating film, wherein, after the protection film is formed to protect the channel region from an etching process that is performed when the opening portion is opened in the insulating film, a portion of the protection film, which is located in the opening portion, is removed and then formed around the opening portion.

According to this aspect, when the electro-optical device substrate is manufactured by means of a method of manufacturing the electro-optical device substrate of the aspect of the invention, which will be described later, it is possible to prevent troubles, such as a decrease in yield due to the damaged semiconductor layer, degradation in display quality due to malfunction of the transistor, or a decrease in reliability. In addition, because the protection film may be easily removed, it is possible to prevent the manufacturing process from becoming complicated.

An aspect of the invention provides an electro-optical device that is provided with the above described electro-optical device substrate according to the invention (including various aspects thereof).

According to the electro-optical device of the aspect of the invention, because it is provided with the above described electro-optical device substrate according to the invention, it is possible to provide the electro-optical device that is able to display a high-quality image.

An aspect of the invention provides an electronic apparatus that includes the above described electro-optical device according to the invention.

According to the electronic apparatus of the aspect of the invention, because it is provided with the above described electro-optical device according to the invention, it is possible to realize various electronic apparatuses that are able to perform high-quality display, such as a projection display device, a cellular phone, a personal organizer, a word processor, a viewfinder type or a direct view type video tape recorder, a workstation, a video telephone, a point-of-sales terminal, or a touch panel. In addition, as the electronic apparatus according to the aspect of the invention, it is possible to, for example, realize an electrophoretic device, or the like, such as an electronic paper.

An aspect of the invention provides a method of manufacturing an electro-optical device substrate. The method includes forming a semiconductor layer, which includes, on a substrate, a channel region has a channel length along a first direction in a first region extending along the first direction in a non-aperture region that separates aperture regions of pixels that are defined at positions corresponding to intersections of data lines and scanning lines, a data line side source/drain region that is electrically connected to a corresponding one of the data lines, a pixel electrode side source/drain region that is electrically connected to a pixel electrode, a first junction region that is formed between the channel region and the data line side source/drain region and a second junction region that is formed between the channel region and the pixel electrode side source/drain region, so that the second junction region is located in an intersection region of the non-aperture region, at which a second region, which extends along a second direction that intersects with the first direction, and the first region intersect with each other, forming a protection film so as to cover the channel region, forming an insulating film so as to cover the semiconductor layer after the protection film has been formed, opening an opening portion to expose the protection film at a portion of the insulating film, which overlaps the channel region by performing etching using a first etchant, exposing the channel region by performing etching on the protection film exposed through the opening portion using a second etchant that is different from the first etchant, forming a gate insulating film on the exposed channel region in the opening portion, and forming a transistor by forming a gate electrode so as to include a body portion formed in the opening portion and an elongated portion extending from the body portion onto the insulating film so as to cover the second junction region, wherein an etching rate to the insulating film by the first etchant is greater than an etching rate to the protection film by the first etchant, wherein an etching rate to the protection film by the second etchant is greater than an etching rate to the semiconductor layer by the second etchant, and wherein an etching rate to the semiconductor layer by the first etchant is greater than the etching rate to the semiconductor layer by the second etchant.

According to the method of manufacturing the electro-optical device substrate of the aspect of the invention, it is possible to manufacture the above described electro-optical device substrate of the aspects of the invention.

In the aspect of the invention, for forming the transistor, first, the semiconductor layer is formed in the first region of the non-aperture region on the substrate along the first direction. At this time, the second junction region is formed to be arranged in the intersection region.

Subsequently, the protection film is formed in an upper layer than the semiconductor layer so as to cover at least the channel region. A portion of the protection film, formed on the semiconductor layer, is removed as will be described later. The protection film is, for example, formed of a material, such as silicon nitride (SiN), of which an etching rate by the second etchant in the above etching process is greater than the semi-conductor layer that is, for example, formed of polysilicon or amorphous silicon. Here, the "second etchant" means an etching gas that is used when a dry etching method is performed on the protection film as an etching process or chemicals that are used when a wet etching method is performed on the protection film as an etching process.

After that, the insulating film is formed in an upper layer than the protection film. The insulating film is, for example, formed of a material, such as silicon oxide (SiO2) of which an etching rate by the first etchant in the etching process in a process of forming the opening portion, which will be described later, is greater than that of the protection film. Here, the "first etchant" means an etching gas that is used when a dry etching method is performed for forming the opening portion as an etching process or chemicals that are used when a wet etching method is performed for forming the opening portion as an etching process.

Subsequently, the opening portion is opened at a portion of the insulating film, which overlaps the channel region, by performing a dry etching method, a wet etching method, or both the dry etching method and the wet etching on the insulating film as an etching process using the first etchant.

Here, the semiconductor layer is, for example, formed of a material, such as polysilicon, of which an etching rate by the first etchant is greater than an etching rate by the second etchant.

Thus, when the opening portion is opened, if the protection film is not formed at least on the channel region, in the etching process using the first etchant, there is a possibility that the selection ratios of the insulating film, which is, for example, formed of silicon oxide film, and the semiconductor layer $1a$ are reduced and, after the opening portion has been opened, the surface of the semiconductor layer exposed to the inside of the opening portion is subjected to the first etchant, and, as a result, the channel region of the semiconductor layer is etched. In addition, there is a possibility that, after the opening portion has been opened, the semiconductor layer is damaged by the first etchant and, as a result, the quality of the layer is degraded.

In contrast, particularly in the aspect of the invention, in a state where at least the channel region of the semiconductor layer is covered with the protection film, the opening portion is opened using the first etchant. Here, the insulating film, the protection film and the semiconductor layer each are formed of a material that has an over etching amount of the semiconductor layer in the etching process of the protection film using the second etchant smaller than an over etching amount of the semiconductor layer in the etching process of the insulating film using the first etchant. In addition, the protection film and the insulating film each are formed of a material having an etching rate to the insulating film by the first etchant greater than an etching rate to the protection film by the first etchant.

Thus, in the etching process using the first etchant, it is possible to increase the selection ratios of the protection film and the insulating film. Moreover, by adjusting the thickness of the film, in addition to forming the protection film of the above described material, it is possible to further effectively increase the selection ratios. Thus, after the opening portion has been opened, even when the surface is subjected to the first etchant in the opening portion, it is possible to prevent the channel region of the semiconductor layer from being damaged because of removal of the protection film from the opening portion by etching.

After that, the protection film is removed from the opening portion by performing a dry etching method, a wet etching method, or both the dry etching method and the wet etching on the protection film exposed in the opening portion as an etching process using the second etchant. Then, because the etching rate to the semiconductor layer using the second etchant is smaller than the etching rate to the protection film using the second etchant, in the etching process using the second etchant, it is possible to increase the selection ratios of the semiconductor layer and the protection film. Thus, in the opening portion, the channel region of the semiconductor layer is prevented from being subjected to the second etchant and then damaged, so that it is possible to easily and reliably remove the protection film.

Note that, when the protection film is arranged so as to cover a region that includes the channel region and a region, other than the channel region, of the semiconductor layer in an upper layer than the semiconductor layer and in a lower layer than the insulating film, after a portion of the protection film, which is located in the opening portion, is removed, the other portion of the protection film remains around the opening portion.

Thereafter, after the gate insulating film has been formed on the channel region of the semiconductor layer that is exposed to the inside of the opening portion, the gate electrode is continuously formed from the opening portion onto the insulating film. More specifically, the body portion is formed in the opening portion, and the elongated portion extends continuously from the body portion onto the insulating film so as to cover the second junction region, thus forming the gate electrode. In this manner, the transistor is formed.

Thus, according to the above described manufacturing method of the aspect of the invention, it is possible to prevent troubles, such as a decrease in yield due to the damaged semiconductor layer, degradation in display quality due to malfunction of the transistor, or a decrease in reliability of the device. In addition, because the protection film may be easily removed, it is possible to prevent the manufacturing process from becoming complicated.

In one aspect of the method of manufacturing the electro-optical device substrate according to the invention, the semiconductor layer may be formed using silicon when the semiconductor layer is formed, wherein the protection film may be formed using silicon nitride film when the protection film is formed, and the insulating film may be formed using silicon oxide film when the insulating film is formed.

According to this aspect, the semiconductor layer, the protection film and the insulating film each are formed so that an over etching amount of the semiconductor layer in the etching process of silicon nitride film as the protection film using the second etchant is smaller than an over etching amount of the semiconductor layer in the etching process of silicon oxide film as the insulating film using the first etchant. In addition, the protection film and the insulating film are formed so that an etching rate to the insulating film by the first etchant is greater than an etching rate to the protection film by the first etchant.

Thus, in the process for opening the opening portion, in the etching process using the first etchant, it is possible to increase the selection ratios of the protection film and the insulating film. In addition, by performing the etching process using the second etchant on the protection film, it is possible to increase the selection ratios of the semiconductor layer and the protection film when the protection film is removed from the opening portion.

In another aspect of the method of manufacturing the electro-optical device substrate according to the invention, the method may include forming each of the scanning lines so as to be electrically connected to the corresponding gate electrode, forming each of the data lines so as to intersect with the scanning lines and to be electrically connected to the corresponding data line side source/drain region, and forming each of the pixel electrodes in the corresponding pixel so as to be electrically connected to the corresponding pixel electrode side source/drain region, wherein at least one of the data lines and the pixel electrodes are formed in an upper layer than the transistors by at least one of forming the data lines and forming the pixel electrodes.

According to this aspect, by at least one of forming the data line and forming the pixel electrode, at least one of the data line and the pixel electrode is formed in an upper layer than the transistor. Thus, a contact hole, in addition to the opening portion, needs to be formed in the insulating film in order to electrically connect at least one of the data line and the pixel electrode to the semiconductor layer.

Here, when the protection film is formed, the protection film is preferably formed so as to cover the channel region and at least one of the data line side source/drain region and the pixel electrode side source/drain region, other than the channel region. In this case, it is possible to form the contact hole through the same manufacturing process as those of opening of the opening portion and removal of the protection film from the opening portion. Thus, when the contact hole is formed in the insulating film in addition to the opening portion, it is possible to increase the selection ratio of the etching process to the insulating film as in the case when the opening portion is opened. In addition, after that, when the protection film is removed from the contact hole as well, it is possible to increase the selection ratio of the etching process as in the case when the protection film is removed from the opening portion.

Moreover, it is possible to open the contact hole using the same manufacturing device as that used to form the opening portion, so that it is advantageous in that the manufacturing process may be simplified and the manufacturing costs may be reduced.

The functions and other advantageous effects of the aspects of invention become apparent from the exemplary embodiments described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the accompanying drawings. In the following embodiments, a TFT active matrix addressing liquid crystal device, which has an installed driving circuit, is used as one example of an electro-optical device according to the aspects of the invention.

Electro-Optical Device

Figure 1:
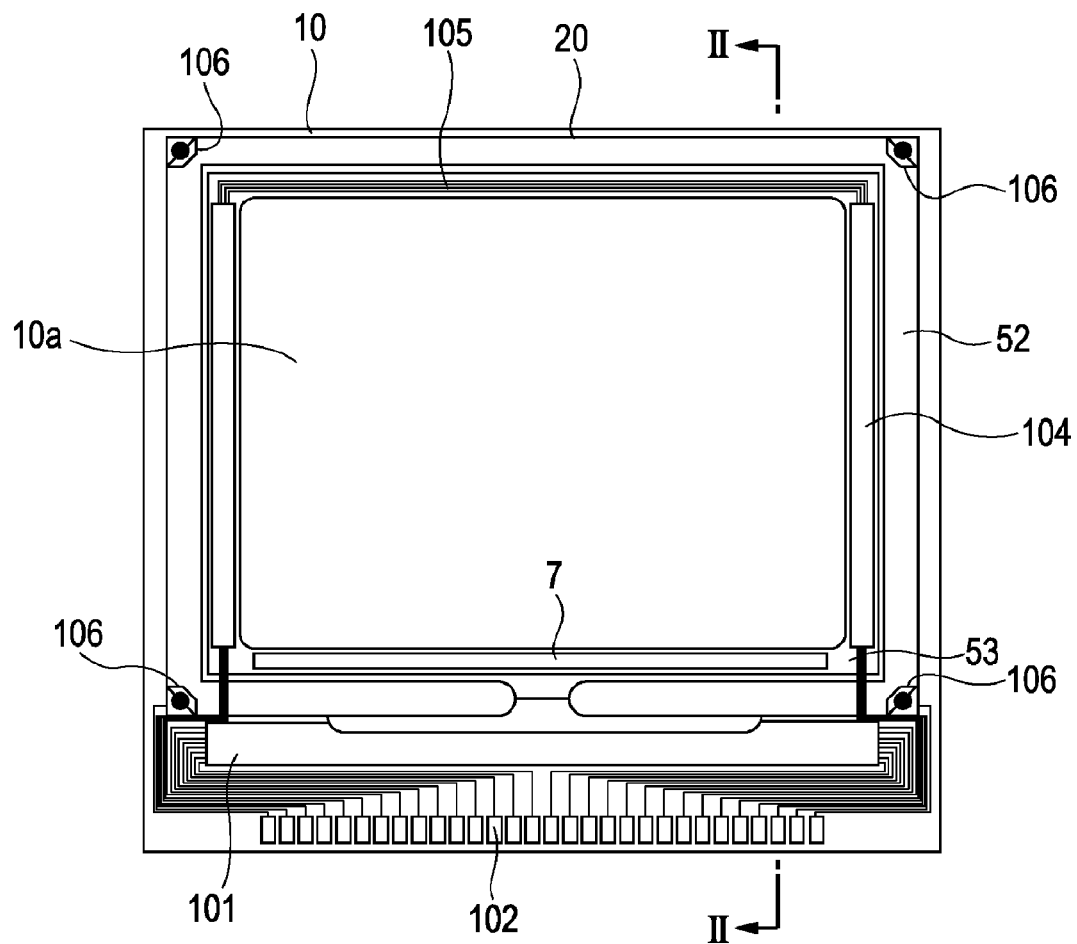
FIG. 1 is a schematic plan view of a liquid crystal device according to an embodiment.
Figure 2:
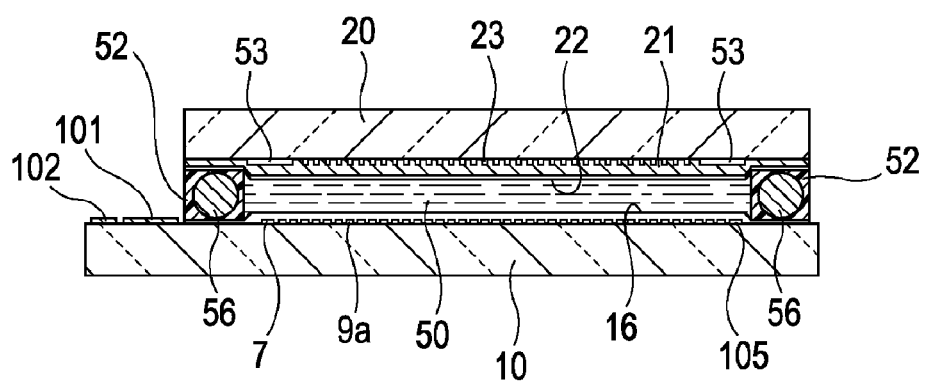
FIG. 2 is a cross-sectional view that is taken along the line II-II in FIG. 1.

The general configuration of the liquid crystal device according to the present embodiment will be described with reference to FIG. 1 and FIG. 2. FIG. 1 is a schematic plan view of the liquid crystal device, showing a TFT array substrate together with various components formed thereon, as viewed from the side of an opposite substrate. FIG. 2 is a cross-sectional view that is taken along the line II-II in FIG. 1.

In FIG. 1 and FIG. 2, the liquid crystal device according to the present embodiment is formed of a TFT array substrate 10 and an opposite substrate 20, which are opposed to each other. The TFT array substrate 10 is a transparent substrate, such as a quartz substrate, a glass substrate, or a silicon substrate, for example. The opposite substrate 20 is also a transparent substrate that is, for example, formed of the same material as that of the TFT array substrate 10. A liquid crystal layer 50 is sealed between the TFT array substrate 10 and the opposite substrate 20. The TFT array substrate 10 and the opposite substrate 20 are adhered to each other by a seal material 52, which is provided in a seal region located around an image display area 10a.

The seal material 52 is, for example, formed of an ultraviolet curing resin, a thermoset resin, or the like, for adhering both substrates. The seal material 52, after being applied on the TFT array substrate 10 in a manufacturing process, is hardened by ultraviolet irradiation, heating, or the like. In addition, for example, in the seal material 52, gap materials 56, such as glass fibers or glass beads, are dispersed in order to form a gap (inter-substrate gap), having a predetermined value, between the TFT array substrate 10 and the opposite substrate 20. The liquid crystal device according to the present embodiment is suitable for performing enlarged display with a small size used for a light valve of a projector.

In parallel to the inside of the seal region in which the seal material 52 is arranged, a window-frame-shaped light shielding film 53, having a light shielding property, that defines a window frame region of the image display area 10a is provided on the side of the opposite substrate 20. However, part or all of the window-frame-shaped light shielding film 53 may be provided on the side of the TFT array substrate 10 as an internal light shielding film.

In a peripheral region located around the image display area 10a on the TFT array substrate 10, a data line driving circuit 101, a sampling circuit 7, scanning line driving circuits 104, and an external circuit connection terminal 102 are formed.

In the peripheral region on the TFT array substrate 10 and on the outer side of the seal region, the data line driving circuit 101 and the external circuit connection terminal 102 are provided along one side of the TFT array substrate 10. In addition, in a region located inside the seal region within the peripheral region on the TFT array substrate 10, the sampling circuit 7 is arranged along one side of the image display area 10a and along one side of the TFT array substrate 10 so as to be covered with the window-frame-shaped light shielding film 53.

The scanning line driving circuits 104 are provided along two sides, adjacent to one side, of the TFT array substrate 10 so as to be covered with the window-frame-shaped light shielding film 53. Moreover, in order to electrically connect the two scanning line driving circuits 104 provided on both sides of the image display area 10a, a plurality of wirings 105 are provided along the remaining one side of the TFT array substrate 10 so as to be covered with the window-frame-shaped light shielding film 53.

Furthermore, in the peripheral region on the TFT array substrate 10, conductive terminals 106 are arranged at regions that are opposed to four corner portions of the opposite substrate 20, and conductive materials are provided between the TFT array substrate 10 and the opposite substrate 20 at positions corresponding to the conductive terminals 106 and electrically connected to the terminals 106.

In FIG. 2, a laminated structure in which pixel switching TFTs, which serve as driving elements, and wirings, such as scanning lines, data lines, and the like, are formed on the TFT array substrate 10. In the image display area 10a, pixel electrodes 9a are provided in a matrix in the upper layer of the pixel switching TFTs and the wirings, such as the scanning lines and the data lines. An alignment layer 16 is formed on the pixel electrodes 9a. Note that, in the present embodiment, each of the pixel switching elements may be various types of transistors, a TFD (Thin Film Diode), or the like, other than the TFT.

On the other hand, a light shielding film 23 is formed on a face of the opposite substrate 20, opposite the TFT array substrate 10. The light shielding film 23 is, for example, formed of a light shielding metal film, or the like, and is patterned, for example, in a grid, or the like, in the image display area 10a on the opposite substrate 20. Then, an opposite electrode 21, which is formed of a transparent material, such as ITO, is formed, for example, in a solid manner on the light shielding film 23 (on the lower side of the light shielding film 23 in FIG. 2) so as to be opposed to the plurality of pixel electrodes 9a. Further, an alignment layer 22 is formed on the opposite electrode 21 (on the lower side of the opposite electrode 21 in FIG. 2).

The liquid crystal layer 50 is, for example, formed of liquid crystal that is mixed with a single or multiple types of nematic liquid crystal. The liquid crystal layer 50 is made into a predetermined aligned state between a pair of these alignment layers. Then, when the liquid crystal device is being driven, liquid crystal holding capacitors are formed between the pixel electrodes 9a and the opposite electrode 21 by being applied with voltage, respectively.

Although not described in the drawing, in addition to the data line driving circuit 101 and the scanning line driving circuits 104, a pre-charge circuit that separately supplies pre-charge signals of predetermined voltage levels to the plurality of data lines in advance of image signals, a check circuit for checking quality, defects, or the like, of the liquid crystal device during manufacturing or upon shipment, or the like, may be formed on the TFT array substrate 10.

Figure 3:
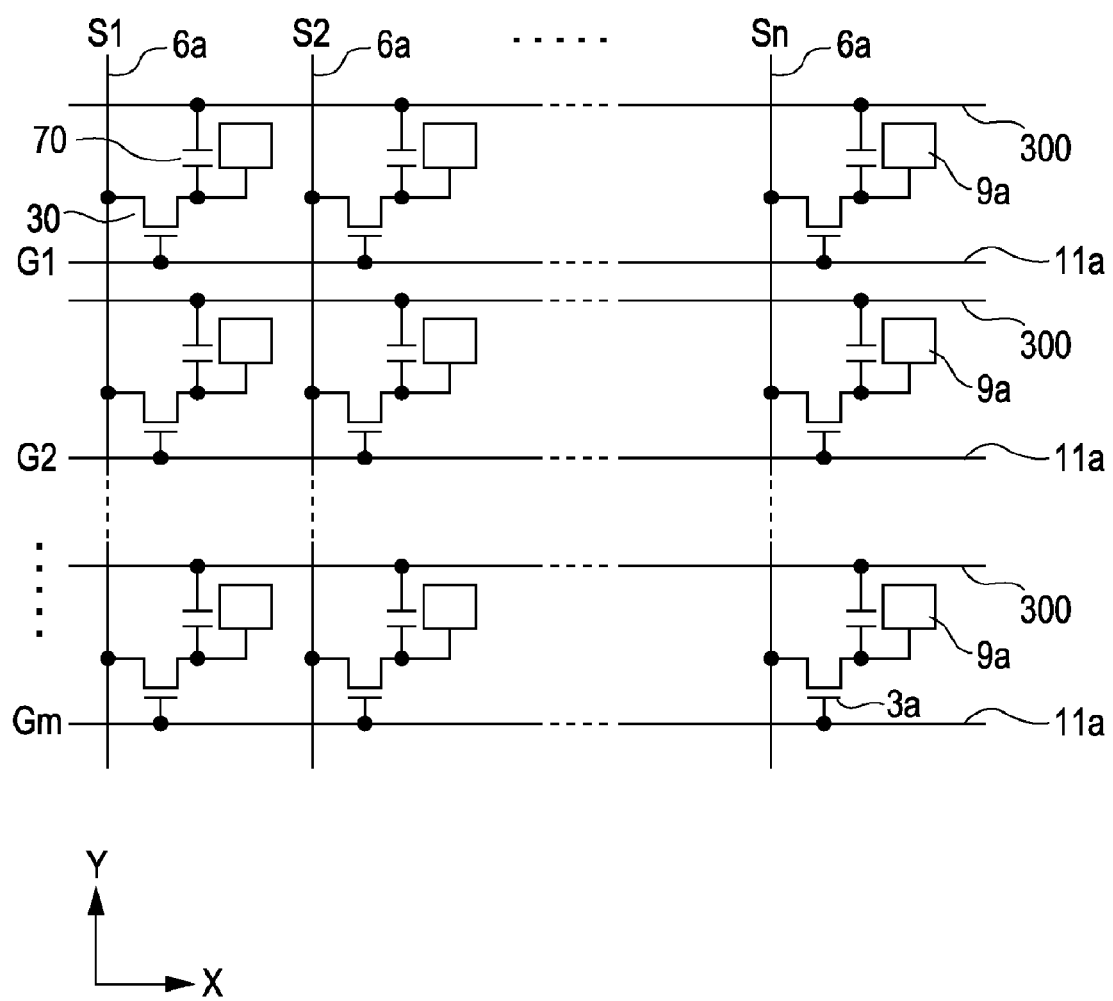
FIG. 3 is an equivalent circuit diagram of various elements, wirings, and the like, in a plurality of pixels that are formed in a matrix and that constitute an image display area of the liquid crystal device according to an embodiment.

The electrical configuration of pixel portions of the liquid crystal device according to the present embodiment will be described with reference to FIG. 3. FIG. 3 is an equivalent circuit diagram of various elements, wirings, and the like, in a plurality of pixels that are formed in a matrix and that constitute an image display area of the liquid crystal device according to the present embodiment.

In FIG. 3, the pixel electrodes 9a and TFTs 30, which serve as one example of a "transistor" according to the aspects of the invention, are formed in each of a plurality of pixels, which are formed in a matrix and constitute the image display area 10a. Each of the TFTs 30 is electrically connected to a corresponding one of the pixel electrodes 9a, and controls switching of the pixel electrode 9a while the liquid crystal device is operating. Each of the data lines 6a, which are supplied with image signals, is electrically connected to the source of the corresponding TFT 30. The image signals S1, S2, . . . , Sn to be written to the data lines 6a may be supplied in line sequential in this order or may be supplied to the plurality of adjacent data lines 6a in units of group.

Each of the scanning lines 11 is electrically connected to the gate of the corresponding TFT 30. The liquid crystal device according to the present embodiment is configured to apply scanning signals G1, G2, . . . , Gm in line sequential in this order at predetermined timing to the scanning lines 11 in the form of pulse. Each of the pixel electrodes 9a is electrically connected to the drain of the corresponding TFT 30. By turning off the TFT 30, which serves as a switching element, only during a certain period, the image signals S1, S2, . . . , Sn supplied from the data lines 6a are written to the corresponding pixel electrodes 9a at predetermined timing. The image signals S1, S2, . . . , Sn of predetermined levels, written through the pixel electrodes 9a to liquid crystal, which is one example of an electro-optical material, are held between the pixel electrodes 9a and the opposite electrode 21, which is formed on the opposite substrate 20, during a certain period of time.

Liquid crystal that constitutes the liquid crystal layer 50 (see FIG. 2) modulates light to enable gray shade as alignment and/or order of molecular association is varied by an applied voltage level. In the case of a normally white mode, a transmittance ratio to incident light is reduced in accordance with a voltage applied in units of pixel. In the case of a normally black mode, a transmittance ratio to incident light is increased in accordance with a voltage applied in units of pixel. As a whole, light having a contrast corresponding to image signals is emitted from the liquid crystal device.

Here, in order to prevent the leakage of image signals being held, storage capacitors 70 are added so as to be electrically in parallel with the liquid crystal capacitors that are formed between the corresponding pixel electrodes 9a and the opposite electrode 21 (see FIG. 2). Each of the storage capacitors 70 is a capacitive element that functions as a holding capacitor that temporarily holds an electric potential of the corresponding pixel electrode 9a in accordance with supply of an image signal. One of electrodes of the storage capacitor 70 is electrically in parallel with the pixel electrode 9a and is connected to the drain of the TFT 30, and the other electrode is connected to a capacitor line 300 having a fixed electric potential so as to be applied with a constant electric potential. Owing to the storage capacitor 70, electric potential holding characteristic is improved in the pixel electrode 9a, and it is possible to improve contrast and to improve display characteristics, such as a reduction in flicker. Note that the storage capacitor 70, as will be described later, also functions as an internal light shielding film that blocks light entering the TFT 30.

Figure 4:
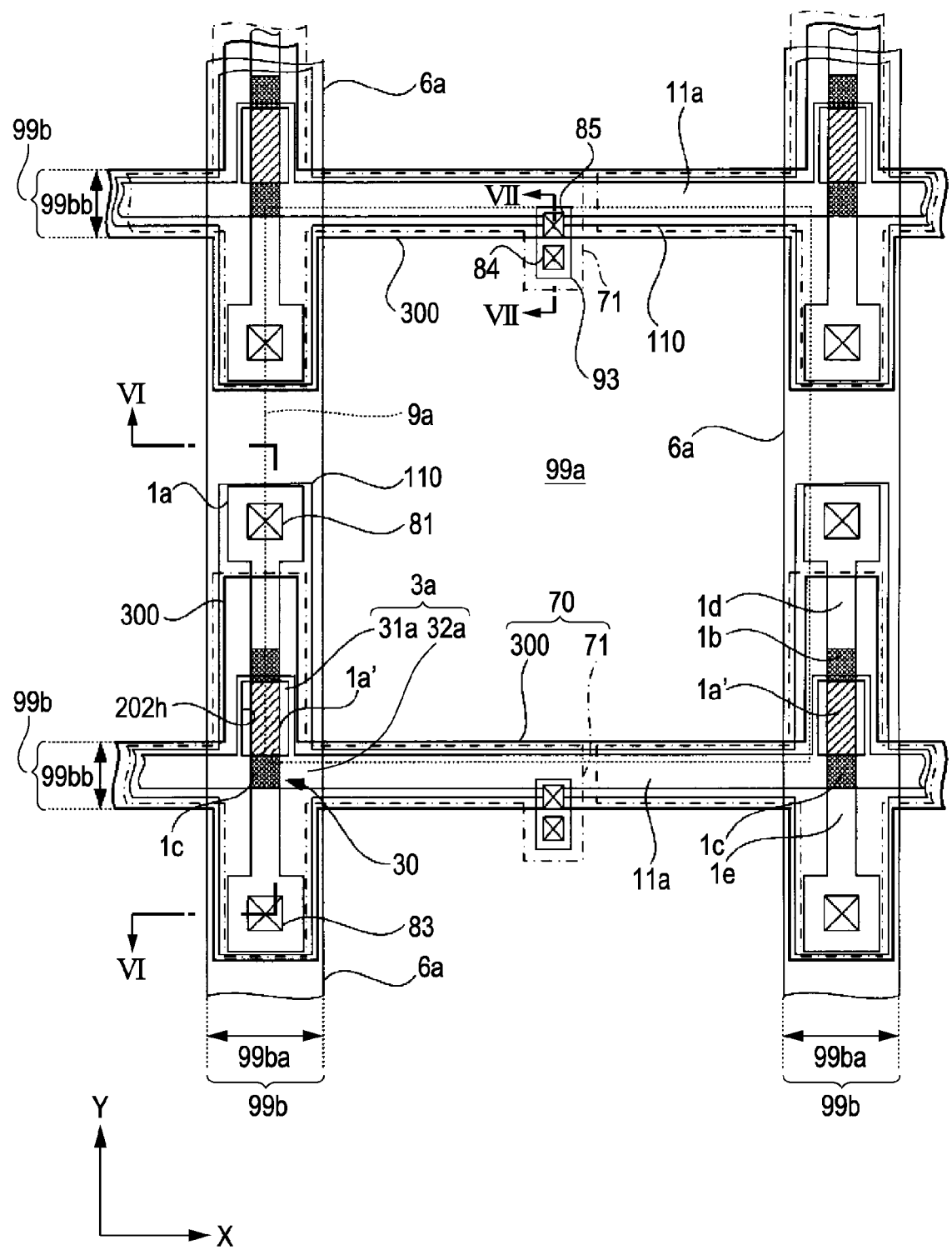
FIG. 4 is a plan view of pixel portions of the liquid crystal device according to the embodiment.
Figure 5:
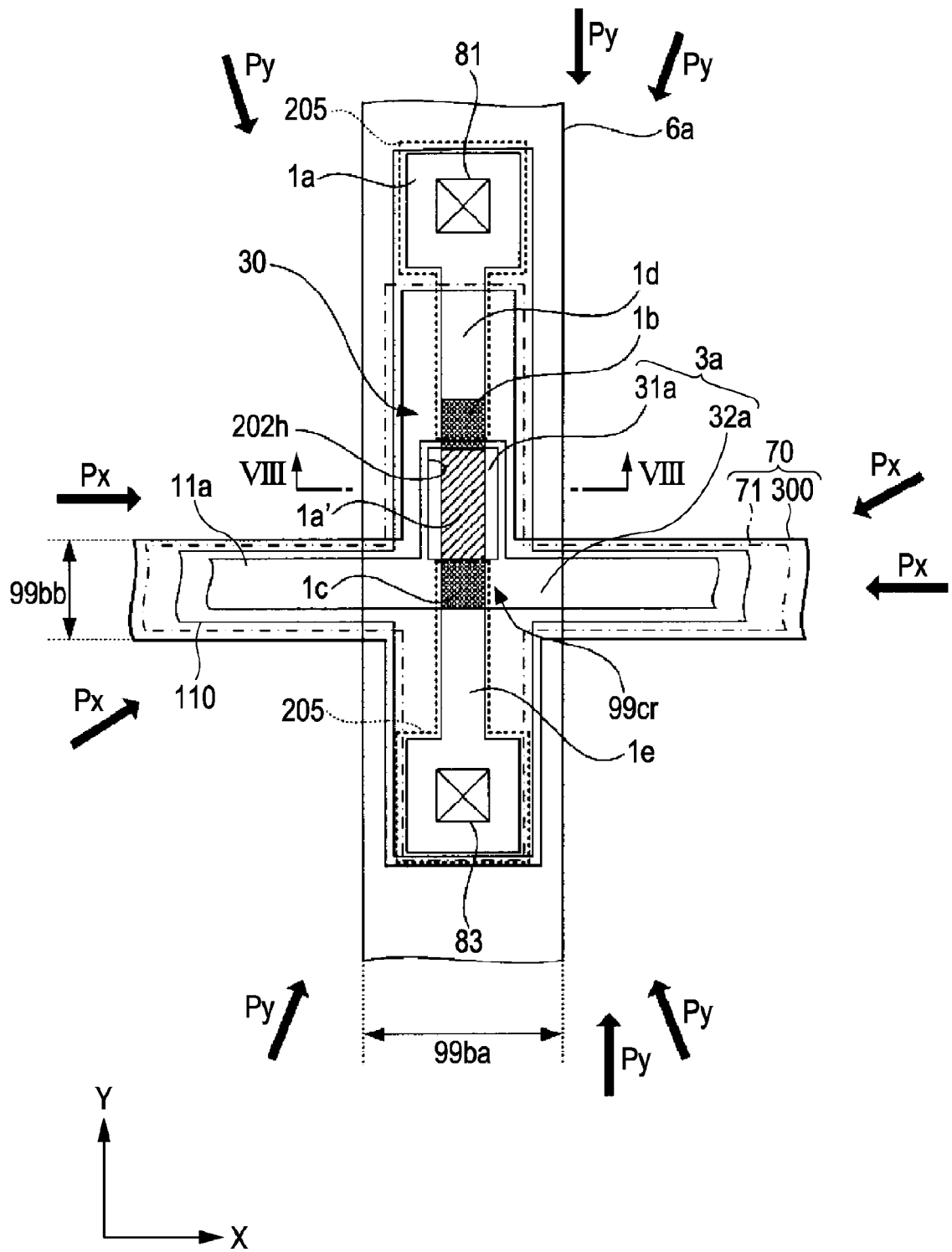
FIG. 5 is a plan view that shows a configuration of the pixel portion, focusing on a configuration of the transistor.
Figure 6:
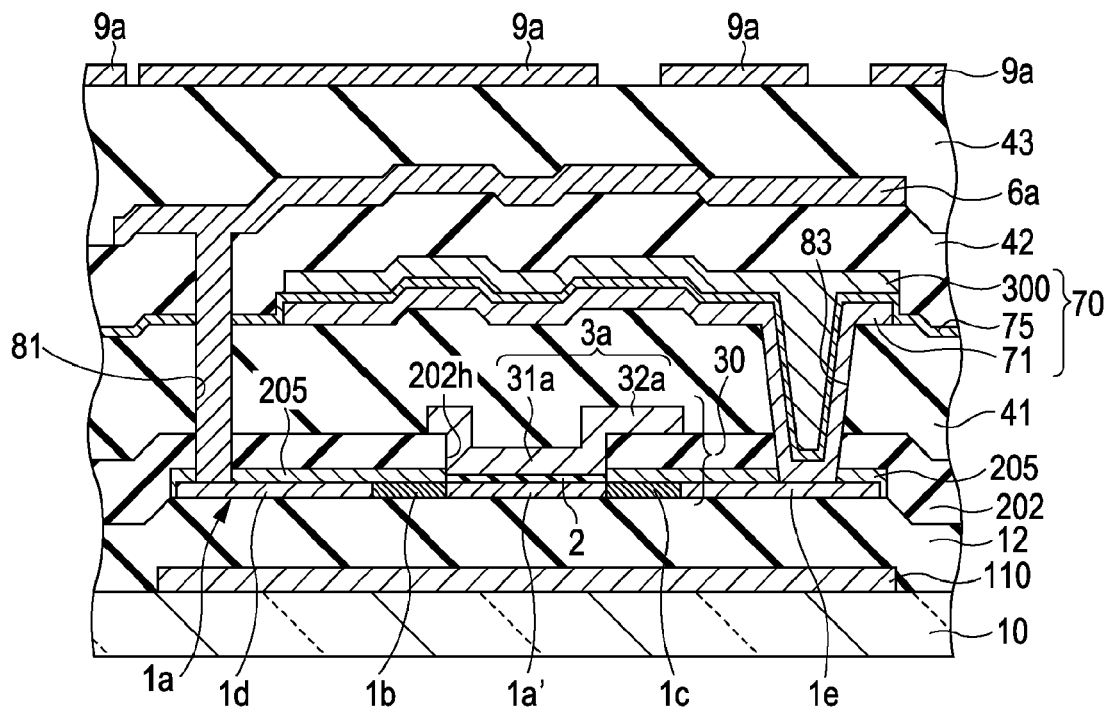
FIG. 6 is a cross-sectional view that is taken along the line VI-VI in FIG. 4.
Figure 7:
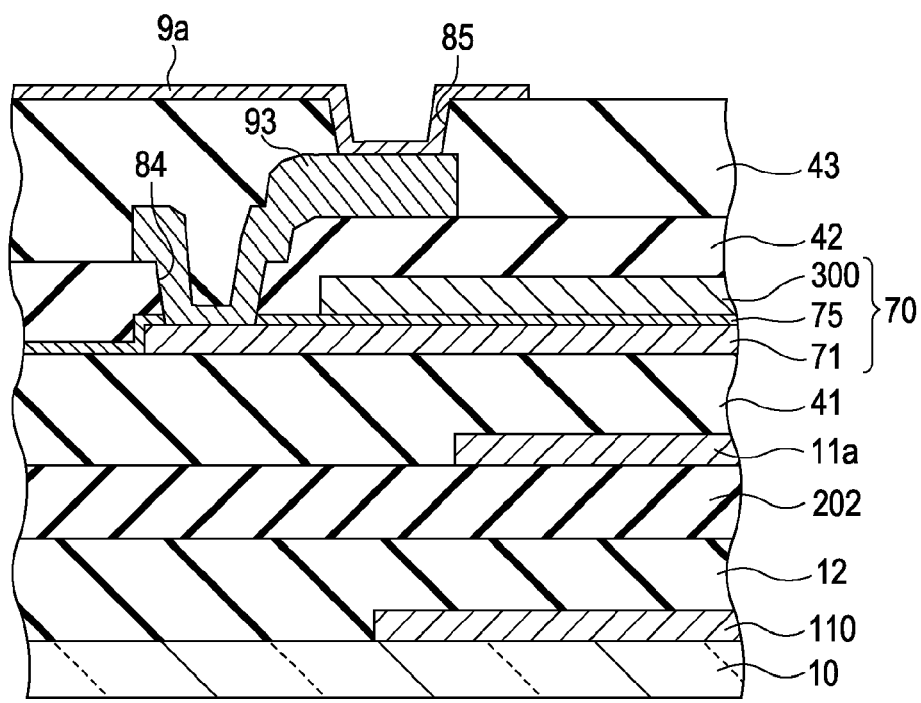
FIG. 7 is a cross-sectional view that is taken along the line VII-VII in FIG. 4.
Figure 8:
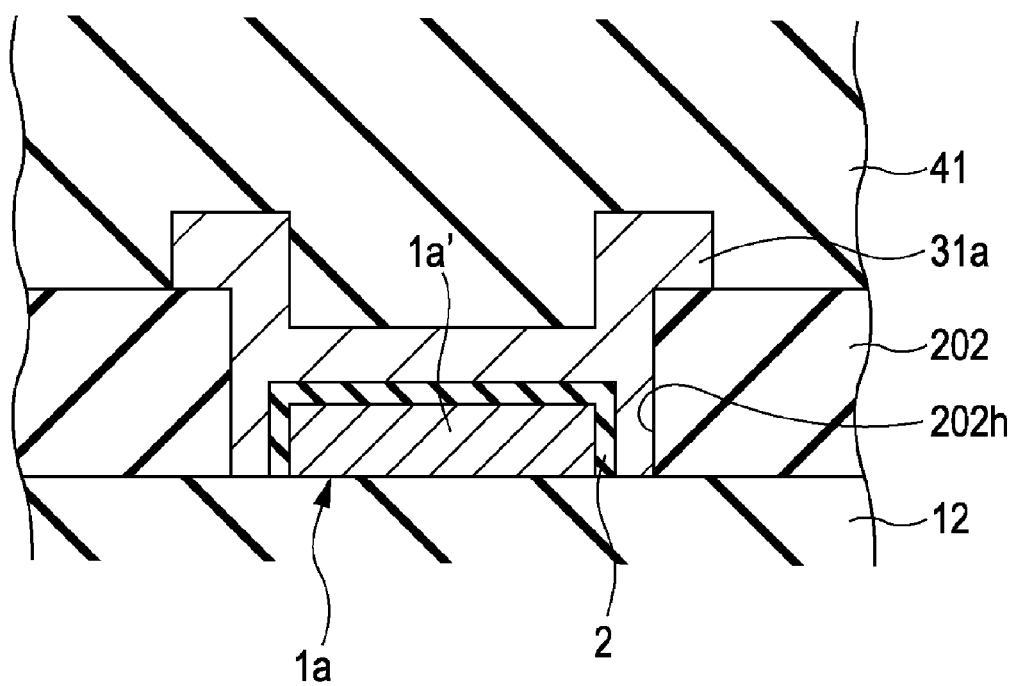
FIG. 8 is a cross-sectional view that is taken along the line VIII-VIII in FIG. 5.

Next, the specific configuration of the pixel portions that implement the above operation will be described with reference to FIG. 4 to FIG. 8 in addition to FIG. 1 to FIG. 3. FIG. 4 is a plan view of the pixel portions. FIG. 5 is a plan view that shows a configuration of the pixel portion, focusing on a configuration of the transistor. FIG. 6 is a cross-sectional view that is taken along the line VI-VI in FIG. 4. FIG. 7 is a cross-sectional view that is taken along the line VII-VII in FIG. 4. FIG. 8 is a cross-sectional view that is taken along the line VIII-VIII in FIG. 5.

Note that, in FIG. 4 to FIG. 8, in order to make it easier to recognize the layers and components in the drawings, the dimensions and ratios of the components are appropriately varied. This also applies to the relevant drawings, which will be described later. In FIG. 4 to FIG. 8, only the configuration of the TFT array substrate side will be described among the configurations described with reference to FIG. 1 or in FIG. 2; however, for easier description, portions located on or above the pixel electrodes 9a are not shown in these drawings. In FIG. 5, focusing on the transistor, a configuration of the transistor is shown in detail, and the arrangement relationship among various films that constitute the data line, the scanning line and the storage capacitor with respect to the transistor in the non-aperture region is schematically shown as well.

Here, in FIG. 6, the portions from the TFT array substrate 10 to the pixel electrodes 9a constitute one example of an "electro-optical device substrate" according to the aspects of the invention.

The plurality of pixel electrodes 9a are provided on the TFT array substrate 10 in a matrix. Then, as shown in FIG. 4, the data lines 6a and the scanning lines 11 are provided along vertical and horizontal boundaries between the adjacent pixel electrodes 9a. The scanning lines 11a extend along the X direction in FIG. 4, and the data lines 6a extend along the Y direction in FIG. 4 so as to intersect with the scanning lines 11a. The pixel switching TFTs 30 are provided at positions at which the scanning lines 11 and the data lines 6a intersect with each other.

The scanning lines 11a, the data lines 6a, the storage capacitors 70, lower side light shielding films 110 that, relay layers 93 and the TFTs 30 are arranged in a non-aperture region 99b on the TFT array substrate 10, which surrounds aperture regions 99a of the pixels (that is, regions of the pixels, in which light is transmitted or reflected to contribute to actual display) corresponding to the pixel electrodes 9a, as viewed in plan. That is, these scanning lines 11a, storage capacitors 70, data lines 6a, lower side light shielding films 110 and TFTs 30 are arranged not in the aperture regions 99a of the pixels but in the non-aperture region 99b so as not to hinder display.

The non-aperture region 99b is formed on the side of the TFT array substrate 10 as a region that is able to block light that will enter the pixels by light shielding films, which are, for example, formed of at least a portion of conductive films that constitute the data lines 6a, the scanning lines 11a or the storage capacitors 70, formed on the side of the TFT array substrate 10, having a light shielding property. More specifically, the non-aperture region 99b includes a first region 99b a extending along the Y direction and a second region 99b b extending along the X direction. In addition, preferably, as described with reference to FIG. 2, the non-aperture region 99b is defined by the light shielding films 23 formed on the side of the opposite substrate 20 in cooperation with the light shielding films on the side of the TFT array substrate 10.

In FIG. 4, FIG. 5 or FIG. 6, the lower side light shielding films 110 are arranged in a lower layer than the semiconductor layers 1a through a base insulating film 12, and are, for example, formed of light shielding conductive material, such as a high-melting point metal material that includes tungsten (W), titanium (Ti), titanium nitride (TiN), and the like. As shown in FIG. 4 or FIG. 5, the lower side light shielding films 110 are formed, for example, along a direction in which the scanning lines 11a extend (that is, in the X direction). That is, the lower side light shielding films 110 are formed in a stripe in the image display area 10a at positions corresponding to the scanning lines 11a. Owing to the lower side light shielding films 110, it is possible to substantially or completely block light that travels toward the TFTs 30 among returned light, such as light reflected on the rear face of the TFT array substrate 10 and/or light that is emitted, in a double-plate projector, from another liquid crystal device and that penetrates through a composite optical system.

The base insulating film 12 is, for example, formed of silicon oxide film. The base insulating film 12 has a function to prevent the surface of the TFT array substrate 10 from being rough while the surface is being polished and a function to prevent the characteristics of the pixel switching TFT 30 from being changed because of dirt that is left after washing, or the like, by forming the base insulating film 12 all over the TFT array substrate 10.

In FIG. 4 to FIG. 6, each of the TFTs 30 is formed to include a semiconductor layer 1a and a gate electrode 3a.

Each of the semiconductor layers 1a is, for example, formed of polysilicon and includes a channel region 1a' having a channel length along the Y direction in FIG. 4, a data line side LDD region 1b, a pixel electrode side LDD region 1c, a data line side source/drain region 1d and a pixel electrode side source/drain region 1e. That is, each of the TFTs 30 has an LDD structure. Note that the data line side LDD region 1b is one example of a "first junction region" according to the aspects of the invention, and the pixel electrode side LDD region 1c is one example of a "second junction region" according to the aspects of the invention.

As shown in FIG. 4 or FIG. 5, the data line side source/drain region 1d and the pixel electrode side source/drain region 1e are formed in substantially mirror symmetry along the Y direction with respect to the channel region 1a'. The data line side LDD region 1b is formed between the channel region 1a' and the data line side source/drain region 1d. The pixel electrode side LDD region 1c is formed between the channel region 1a' and the pixel electrode side source/drain region 1e. The data line side LDD region 1b, the pixel electrode side LDD region 1c, the data line side source/drain region 1d and the pixel electrode side source/drain region 1e are impurity regions that are formed by implanting impurities into the semiconductor layer 1a by means of impurity implantation, such as ion implantation, for example. The data line side LDD region 1b and the pixel electrode side LDD region 1c are formed as lightly-doped impurity regions that respectively have smaller impurities than the data line side source/drain region 1d and the pixel electrode side source/drain region 1e. According to the above impurity regions, while the TFT 30 is not operating, it is possible to reduce an off current that flows through the source region and the drain region and also possible to suppress a decrease in on current that flows while the TFT 30 is operating. Note that the TFT 30 preferably has an LDD structure; however, the TFT 30 may have an offset structure in which impurities are not implanted in the data line side LDD region 1b and the pixel electrode side LDD region 1c, or may have a self-aligned structure in which the data line side source/drain region and the pixel electrode side source/drain region are formed by implanting impurities densely using the gate electrode as a mask.

In FIG. 4 to FIG. 6, each of the gate electrodes 3a has an elongated portion 32a and a body portion 31a. The elongated portion 32a is arranged in an upper layer than the semiconductor layer 1a through an insulating film 202. The body portion 31a is integrally and continuously formed with the elongated portion 32a in an opening portion 202h that opens at a portion of the insulating film 202, which overlaps the channel region 1a' in plan view.

FIG. 8 is a cross-sectional view that, focusing on the opening portion 202h, shows only a configuration of the opening portion 202h in a portion in cross-section, taken along the line VIII-VIII in FIG. 5.

As shown in FIG. 8, the body portion 31a is a portion that substantially functions as a gate electrode while the TFT 30 is operating, and is formed in the opening portion 202h so as to overlap the channel region 1a' through the gate insulating film 2.

In FIG. 5 or FIG. 6, the elongated portion 32a is formed in an upper layer than the semiconductor layer 1a through the insulating film 202 so as to overlap the pixel electrode side LDD region 1c in plan view. Thus, light that will enter the pixel electrode side LDD region 1c from the upper layer thereof may be blocked by the elongated portion 32a. Because the elongated portion 32a is arranged immediately above the pixel electrode side LDD region 1c through the insulating film 202, it is possible to further reliably reduce light that travels to a lower layer than the elongated portion 32a, passes the insulating film 202 and then enters the pixel electrode side LDD region 1c.

In FIG. 5, the pixel electrode side LDD region 1c is arranged in the non-aperture region 99b at an intersection region 99cr at which the first region 99ba and the second region 99bb intersects with each other. In the intersection region 99cr, among rays of light that will enter the pixel electrode side LDD region 1c from an upper layer thereof, light that travels along a traveling direction indicated by the arrow Py in FIG. 5 may be blocked by the first region 99ba, and light that travels along a traveling direction indicated by the arrow Px in FIG. 5 may be blocked by the second region 99bb. Note that, in FIG. 5, the arrow Py indicates one example of a traveling direction of light having a component that travels along the Y direction, and the arrow Px indicates one example of a traveling direction of light having a component that travels along the X direction.

Thus, owing to the intersection region 99cr in addition to the elongated portion 32a, it is possible to block light that travels toward the pixel electrode side LDD region 1c by the first region 99ba and the second region 99bb. Hence, it is possible to reduce light that enters the pixel electrode side LDD region 1c.

Here, as will be described later in detail, the inventors of the present application have estimated that light leakage current tends to occur in the TFT 30 particularly when light is irradiated to the pixel electrode side LDD region 1c than when light is irradiated to the data line side LDD region 1b. In the present embodiment, a light shielding property pinpoint to the pixel electrode side LDD region 1c among the various regions formed in the semiconductor layer 1a may be enhanced. Thus, it is possible to effectively reduce light leakage current of the TFT 30 in each pixel.

In addition, in the present embodiment, even when no additional light shielding region, other than the intersection region 99cr, is provided for the pixel electrode side LDD region 1c, it is possible to enhance a light shielding property pinpoint to the pixel electrode side LDD region 1c. Thus, by providing a region for pinpoint enhancement of a light shielding property, an area of arrangement for the non-aperture region 99b increases and, hence, it is possible to prevent the aperture regions 99a from being reduced. As a result, even when the pixels are miniaturized, it is possible to improve a light shielding property in a pinpoint manner, and also to improve an aperture ratio.

In addition, the elongated portion 32a is formed in an upper layer than the pixel electrode side LDD region 1c through the insulating film 202, and is electrically insulated from the pixel electrode side LDD region 1c. Thus, while the TFT 30 is operating, it is possible to prevent the occurrence of malfunction in the TFT 30 because of an electrical influence given to the pixel electrode side LDD region 1c by electric field that is generated in the elongated portion 32a formed integrally with the body portion 31a that substantially functions as a gate electrode.

Moreover, the elongated portion 32a and the body portion 31a are arranged at positions different from each other in a vertical direction perpendicular to the substrate plane of the TFT array substrate 10, but they are formed integrally with each other. Thus, because these elongated portion 32a and body portion 31a are arranged at positions that are different in height from each other, in comparison with the case where an elongated portion and a body portion are formed separately in a pattern, it is possible to prevent troubles, such as interruption of electrical connection between the elongated portion 32a and the body portion 31a or a short circuit of the elongated portion 32a to the pixel electrode side LDD region 1c, even when pixels are miniaturized. Accordingly, it is possible to prevent the occurrence of malfunction in the TFT 30 because of a trouble related to such an electrical connection.

Here, in the present embodiment, in the semiconductor layer 1a, the channel region 1a' is, for example, arranged partly in the intersection region 99cr within the first region 99ba and also arranged outside the intersection region 99cr. Thus, the body portion 31a is arranged outside the intersection region 99cr in the opening portion 202h so as to overlap the channel region 1a'. Thus, by integrally forming the elongated portion 32a that is arranged in the intersection region 99cr so as to overlap the pixel electrode side LDD region 1c and the body portion 31a that is arranged in a region different from the elongated portion 32a, it is possible to easily form the gate electrode 3a. As a result, because the intersection region 99cr may be formed with a minimum necessary area of arrangement, required for arranging the pixel electrode side LDD region 1c, it is possible to further easily miniaturize pixels while improving an aperture ratio.

The insulating film 202 is, for example, formed of silicone oxide film. The liquid crystal device of the present embodiment is manufactured in a manufacturing process, which will be described later, so that, as shown in FIG. 5 or FIG. 6, a protection film 205, which is, for example, formed of silicon nitride film, is formed around the opening portion 202h of the insulating film 202.

In FIG. 4 or FIG. 6, the scanning lines 11a are formed in an upper layer than the semiconductor layers 1a through the insulating film 202 so as to extend in the X direction. The scanning lines 11a are, for example, formed of conductive polysilicon. Preferably, the elongated portion 32a of the gate electrode 3a extends along the X direction, and is formed integrally with the scanning line 11a.

In FIG. 6, the storage capacitor 70 is provided in an upper layer than the TFT 30 on the TFT array substrate 10 through an interlayer insulating film 41.

The storage capacitor 70 is formed so that a lower capacitor electrode 71 and an upper capacitor electrode 300 are opposed to each other through a dielectric film 75.

The upper capacitor electrode is formed as a portion of the capacitor line 300. Although a configuration of the capacitor line 300 is not shown in the drawing, the capacitor line 300 extends from the image display area 10a, in which the pixel electrodes 9a are arranged, to the periphery of the image display area 10a, and is electrically connected to a constant electric potential source. In this manner, the upper capacitor electrode 300 is maintained at a fixed electric potential and functions as a fixed electric potential side capacitor electrode. The upper capacitor electrode 300 is, for example, formed of an opaque metal film that contains metal, such as Al (aluminum), Ag (silver), for example, or alloy of them, and functions as an upper side light shielding film (internal light shielding film) that shields the TFT 30. Note that, the upper capacitor electrode 300 may be, for example, formed of metal element substance, alloy, metal silicide, or polysilicide, which contains at least one of high-melting point metals, such as Ti (titanium), Cr (chromium), W (tungsten), Ta (tantalum), Mo (molybdenum), Pd (palladium), or a laminated structure of them.

In FIG. 4 or FIG. 6, the lower capacitor electrode 71 is a pixel electric potential side capacitor electrode that is electrically connected to both the pixel electrode side source/drain region 1e of the TFT 30 and the pixel electrode 9a. More specifically, the lower capacitor electrode 71 is electrically connected through a contact hole 83 (see FIG. 4 and FIG. 6) to the pixel electrode side source/drain region 1e and also electrically connected through a contact hole 84 (see FIG. 4 and FIG. 7) to a relay layer 93. Furthermore, the relay layer 93 is electrically connected through a contact hole 85 (see FIG. 4 and FIG. 7) to the pixel electrode 9a. That is, the lower capacitor electrode 71, in cooperation with the relay layer 93, relays electrical connection between the pixel electrode side source/drain region 1e and the pixel electrode 9a. The lower capacitor electrode 71 is, for example, formed of conductive polysilicon or opaque metal film that contains, for example, metal, such as Al (aluminum), or alloy.

Here, the lower capacitor electrode 71 preferably not only functions as the pixel electric potential side capacitor electrode but also functions as a light absorption layer or a light shielding film arranged between the TFT 30 and the upper capacitor electrode 300, which serves as the upper side light shielding film. Thus, in the intersection region 99cr, light that will enter the pixel electrode side LDD region 1c from an upper layer thereof may be blocked by the upper capacitor electrode 300 and the lower capacitor electrode 71 as well.

The dielectric film 75 has a monolayer structure or a multilayer structure, which is, for example, formed of silicon oxide film, such as HTO (High Temperature Oxide) film or LTO (Low Temperature Oxide) film, silicon nitride film, or the like.

In FIG. 6 and FIG. 7, the data line 6a and the relay layer 93 are provided in an upper layer than the storage capacitor 70 through the interlayer insulating film 42 on the TFT array substrate 10.

The data line 6a is electrically connected to the data line side source/drain region 1d of the semiconductor layer 1a through a contact hole 81 that extends through insulating film 202, the interlayer insulating film 41, the dielectric film 75 and the interlayer insulating film 42. The data line 6a and the inside of the contact hole 81 are, for example, formed of a material that contains Al (aluminum), such as Al—Si—Cu or Al—Cu, Al element substance, or a multilayer film formed of Al layer and TiN layer. The data line 6a also has a function to shield the TFT 30 against light.

As shown in FIG. 4 or FIG. 5, the data line 6a is formed in the intersection region 99cr so as to overlap the elongated portion 32a of the gate electrode 3a. Thus, in the intersection region 99cr, light that will enter the pixel electrode side LDD region 1c from an upper layer thereof may be blocked by the data line 6a as well.

In FIG. 4 and FIG. 7, the relay layer 93 is formed in the same layer as the data line 6a (see FIG. 6) on the interlayer insulating film 42. The data line 6a and the relay layer 93 are, for example, formed in such a manner that a thin film formed of a conductive material, such as a metal film, is formed on the interlayer insulating film 42 using thin-film formation method, and the thin film is partly removed, that is, patterned. Thus, the data line 6a and the relay layer 93 are formed so as to be spaced apart from each other. Thus, because the data line 6a and the relay layer 93 may be formed in the same process, it is possible to simplify a manufacturing process of the device.

In FIG. 6 and FIG. 7, the pixel electrode 9a is formed in an upper layer than the data line 6a through the interlayer insulating film 43. The pixel electrode 9a is electrically connected through the lower capacitor electrode 71, the contact holes 83, 84 and 85, and the relay layer 93 to the pixel electrode side source/drain region 1e of the semiconductor layer 1a. The contact hole 85 is formed so that a conductive material, such as ITO, that constitutes the pixel electrode 9a is deposited on the inner wall of a hole portion that is formed to extend through the interlayer insulating film 43. An alignment layer 16, on which a predetermined alignment process, such as rubbing process, has been performed, is provided on the upper surface of the pixel electrode 9a.

The configuration of the pixel portion as described above is common to the pixel portions. The above configured pixel portion is regularly formed in the image display area 10a (see FIG. 1).

Thus, in the liquid crystal device according to the present embodiment as described above, while the device is operating, it is possible to prevent the occurrence of display defects or to reduce a degree of display defect to such a degree that, on the display, it is not recognized as a display defect, because of an occurrence of light leakage current of the TFT 30. In addition, it is possible to easily miniaturize the pixels while preventing malfunction of the TFT 30 and/or a decrease in aperture ratio. As a result, in the present embodiment, it is possible to display a high-quality image in the liquid crystal device.

Here, the reason why light leakage current tends to occur in the pixel electrode side LDD region 1c while the TFT 30 is operating as described above, in comparison with the data line side LDD region 1b, will be described in detail with reference to FIG. 9 to FIG. 14.

Figure 9:
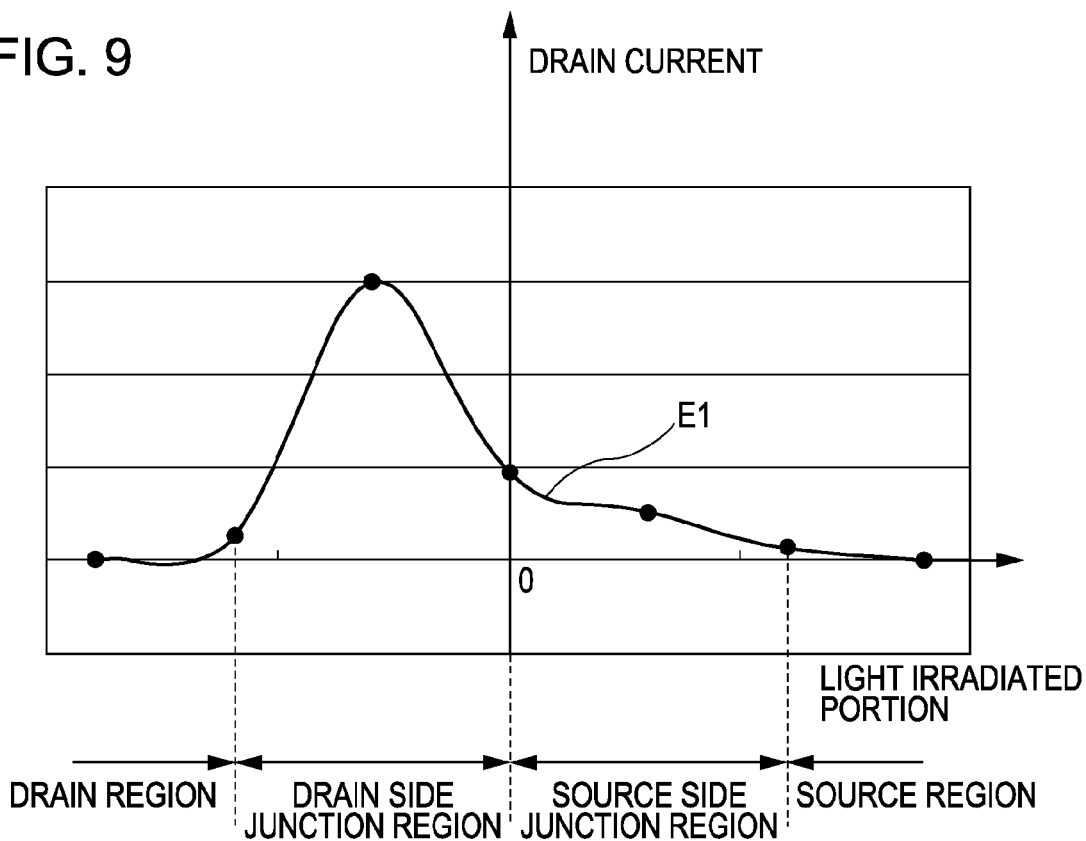
FIG. 9 is a graph that shows a relationship, in a testing TFT, between a light irradiated portion and a drain current.

First, the measured results that were obtained by measuring the magnitude of drain current when light is irradiated to a testing TFT will be described with reference to FIG. 9. FIG. 9 is a graph that shows a relationship, in a testing TFT, between a light irradiated portion and a drain current.

In FIG. 9, data E1 are results obtained by measuring the magnitude of drain current when a light spot (visible light laser of approximately 2.4 um) is irradiated to a testing single TFT, that is, TEG (Test Element Group), while being scanned sequentially from the drain region side to the source region side. The TEG has, in addition to the channel region, the source region and the drain region, a source side junction region formed at a junction between the channel region and the source region and a drain side junction region formed at a junction between the channel region and the drain region.

Note that the abscissa axis of FIG. 9 represents light irradiated portion to which a light spot is irradiated, and the boundary between the channel region and the drain side junction region, the boundary between the channel region and the source side junction region, and further the channel region are defined as zero. The ordinate axis of FIG. 9 represents the magnitude of drain current (however, a relative value that is normalized using a predetermined value). The ordinate axis indicates a positive value (that is, a plus value) when the drain current flows from the drain region to the source region. The ordinate axis indicates a negative value (that is, a minus value) when the drain current flows from the source region to the drain region.

In FIG. 9, the data E1 indicate a plus value at any light irradiated portions. That is, the data E1 indicate that the drain current flows from the drain region to the source region. In addition, the data E1 indicate a larger value in the drain side junction region than in the source side junction region. That is, the data E1 indicate that the drain current is larger when a light spot is irradiated to the drain side junction region than when a light spot is irradiated to the source side junction region. In other words, light leakage current becomes larger when a light spot is irradiated to the drain side junction region than when a light spot is irradiated to the source side junction region. Note that the drain current is composed of dark current (or a subthreshold leakage, that is, leakage current that flows, in an off state of TEG, between the source region and the drain region even in a state where light is not irradiated) and light leakage current (or photoexcited current, that is, current that is generated because of excited electron by irradiating light).

Figure 10:
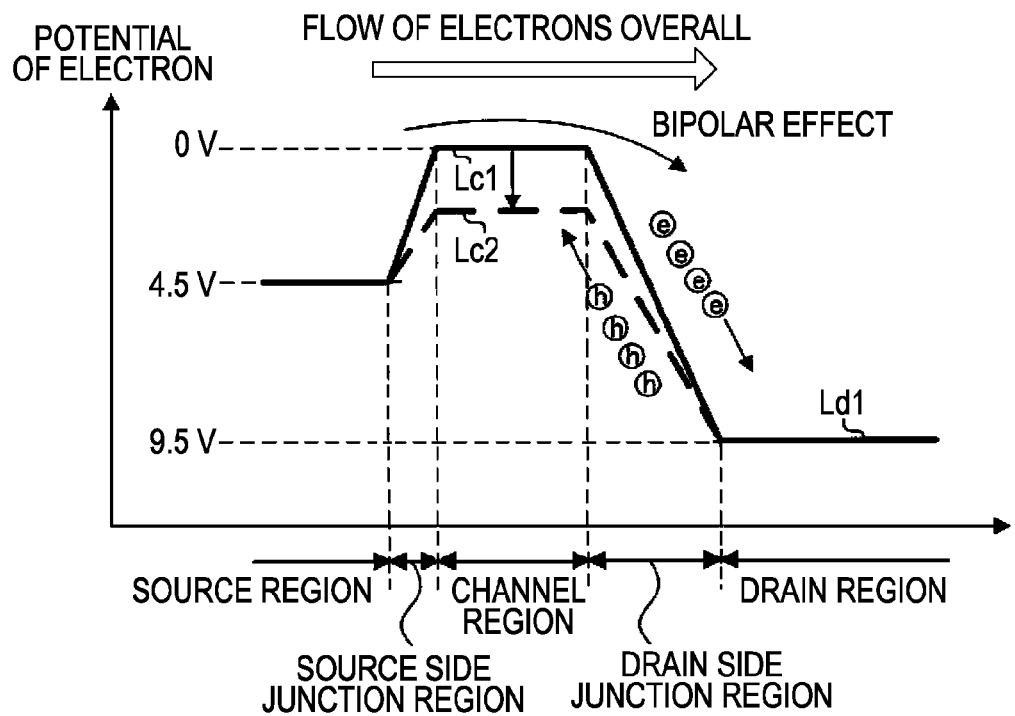
FIG. 10 is a conceptional diagram that shows the behavior of a carrier when photoexcitation occurs in a drain side junction region.
Figure 11:
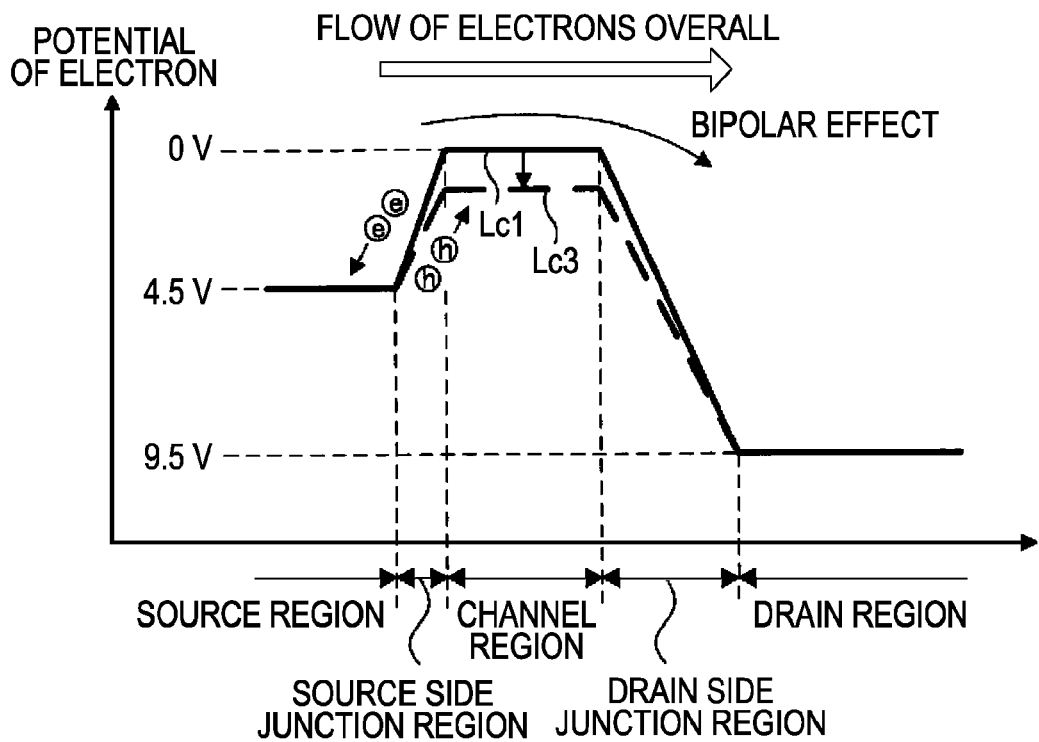
FIG. 11 is a conceptional diagram that shows the behavior of a carrier when photoexcitation occurs in a source side junction region.

Next, mechanism in which light leakage current becomes larger when a light spot is irradiated to the drain side junction region than when a light spot is irradiated to the source side junction region will be described with reference to FIG. 10 and FIG. 11. FIG. 10 is a conceptional diagram that shows the behavior of a carrier when photoexcitation occurs in the drain side junction region. FIG. 11 is a conceptional diagram that shows the behavior of a carrier when photoexcitation occurs in the source side junction region. Note that, in FIG. 10 and FIG. 11, by assuming display of a middle gray scale in the pixel electrode 9a that is electrically connected to the above described TFT 30, the source electric potential (that is, the electric potential of the source region) is 4.5 V, the gate electric potential (that is, the electric potential of the channel region) is 0 V, and the drain electric potential (that is, the electric potential of the drain region) is 9.5 V. The abscissa axes of FIG. 10 and FIG. 11 each represent regions in the semiconductor layer that constitutes the TEG. The ordinate axes of FIG. 10 and FIG. 11 each represent a potential of electron (Fermi level). Electron has a negative electric charge, so that the potential of electron becomes lower the higher the electric potential is in the region, and the potential of electron becomes higher the lower the electric potential is in the region.

FIG. 10 shows the behavior of a carrier when a light spot is irradiated to the drain side junction region formed between the channel region and the drain region and then photoexcitation occurs in the drain side junction region.

In FIG. 10, light leakage current may be estimated to be composed of two current components.

That is, as a first current component, the light leakage current has a current component because of movement of electrons generated by photoexcitation. More specifically, the first current component is a current component that is generated when electrons (see "e" in the drawing) generated by photoexcitation in the drain side junction region move from the drain side junction region to the drain region having a lower potential (this current component flows from the drain region to the source region).

As a second current component, the light leakage current has a current component because of movement of holes (that is, positive holes, denoted by "h" in the drawing) generated by photoexcitation. More specifically, the second current component is a current component because of the bipolar effect that is generated when holes generated by photoexcitation in the drain side junction region move from the drain side junction region to the channel region having a lower potential (that is, higher potential as to electrons). That is, the current component (this current component flows from the drain region to the source region) is due to the effect such that electrons that move from the source region to the drain region increase because the potential of the channel region (that is, a base potential) is reduced from a potential Lc1 to a potential Lc2 because of positive electric charges of holes that have moved to the channel region. Thus, when photoexcitation occurs in the drain side junction region, both the first current component and the second current component are generated in a direction (that is, in a direction from the drain region to the source region) to increase the drain current (in other words, collector current).

FIG. 11 shows the behavior of a carrier when a light spot is irradiated to the source side junction region formed between the channel region and the source region and then photoexcitation occurs in the source side junction region.

In FIG. 11, light leakage current may be estimated to be dominantly composed of the second current component due to the bipolar effect by which holes move from the source side junction region to the channel region having a lower potential (that is, higher potential as to electrons) which is different from the case where photoexcitation occurs in the drain side junction region as described with reference to FIG. 10. That is, it may be estimated that the first current component (this current component flows from the source region to the drain region) that is generated when electrons (see "e" in the drawing) generated by photoexcitation in the source side junction region move from the source side junction region to the source region having a lower potential is smaller than the second current component (this current component flows from the drain region to the source region) due to the bipolar effect.

In FIG. 11, the second current component due to the bipolar effect (that is, the current component due to the effect such that electrons that advances from the source region to the drain region because the base potential is reduced from a potential Lc1 to a potential Lc3 by positive electric charge of holes that have moved to the channel region) flows from the drain region to the source region. On the other hand, the above described first current component flows from the source region to the drain region. That is, the first current component and the second current component flow in the opposite directions. Here, referring back to FIG. 9, the drain current (see data E1) indicates a positive value when a light spot is irradiated from the source side junction region. That is, in this case, the drain current flows from the drain region to the source region. Thus, the first current component just suppresses the current component due to the bipolar effect, which is dark current or the second current component, and is not so large as to cause the drain current to flow from the source region to the drain region.

Moreover, because a difference in electric potential between the channel region and the source region is smaller than a difference in electric potential between the channel region and the drain region, a depleted region on the source region side (that is, the source side junction region) is narrower than a depleted region on the drain region side (that is, the drain side junction region). For this reason, when a light spot is irradiated to the source side junction region, the absolute magnitude of photoexcitation is small as compared with the case when a light spot is irradiated to the drain side junction region.

As described with reference to FIG. 10 and FIG. 11, when photoexcitation occurs in the drain side junction region, the first current component and the second current component both are generated to increase the drain current. On the other hand, when photoexcitation occurs in the source side junction region, the first current component suppresses the second current component. Thus, the drain current becomes larger (that is, light leakage current becomes large) when a light spot is irradiated to the drain side junction region than when a light spot is irradiated to the source side junction region.

Figure 12:
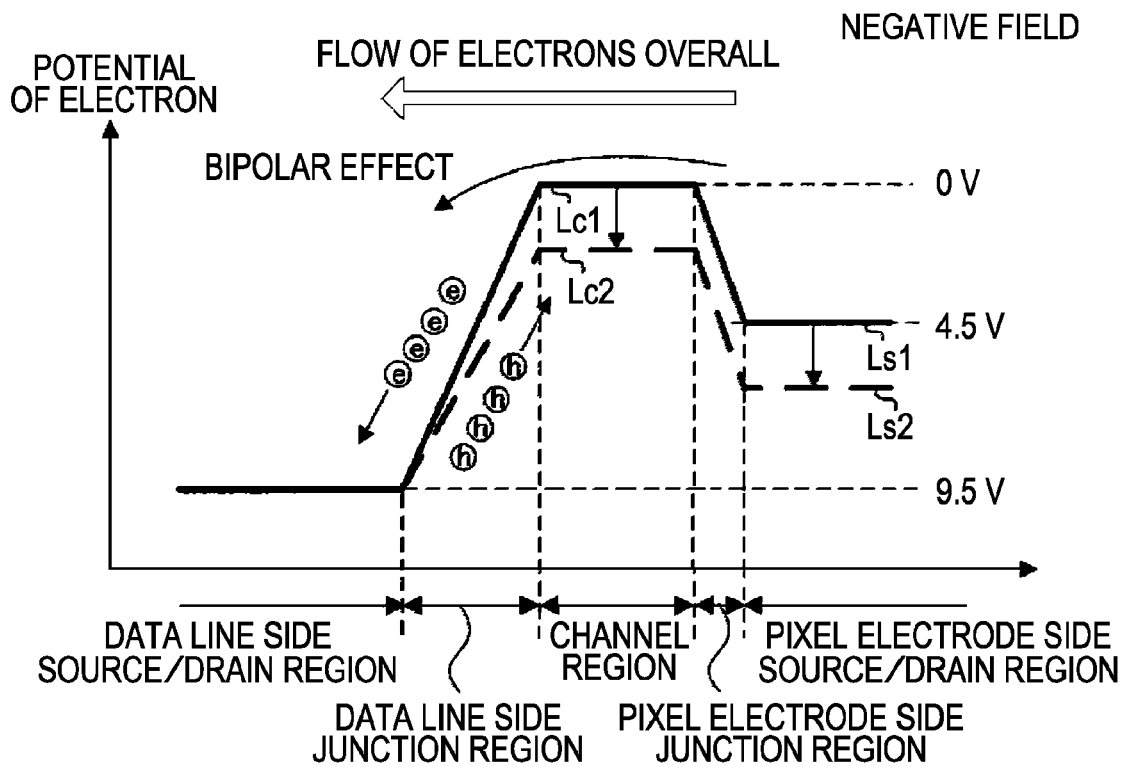
FIG. 12 is a conceptional diagram that shows the behavior of a carrier when photoexcitation occurs in a data line side junction region (in other words, a drain side junction region) in the case where a data line side source/drain region is applied with a drain electric potential.
Figure 13:
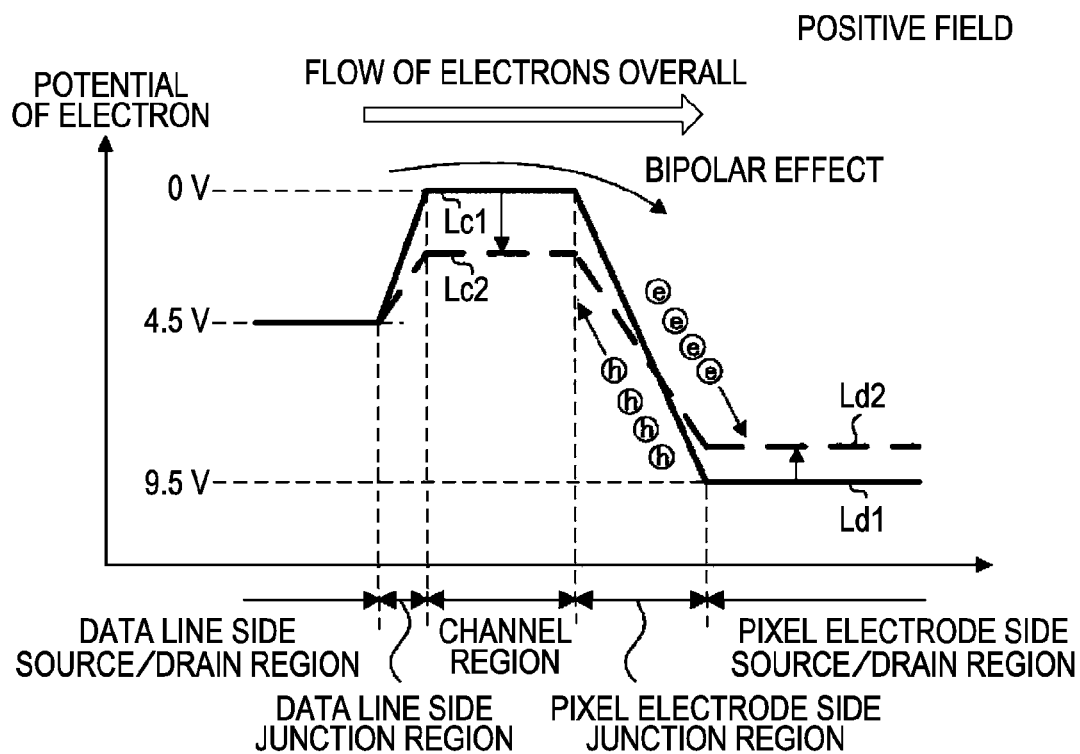
FIG. 13 is a conceptional diagram that shows the behavior of a carrier when photoexcitation occurs in a pixel electrode side junction region (in other words, a drain side junction region) in the case where the pixel electrode side source/drain region is applied with a drain electric potential.

Next, mechanism in which light leakage current increases when the pixel electrode side source/drain region is applied with a drain electric potential and a light spot is irradiated to the pixel electrode side junction region than when the data line side source/drain region is applied with a drain electric potential and a light spot is irradiated to the data line side junction region will be described with reference to FIG. 12 and FIG. 13. Here, FIG. 12 is a conceptional diagram that shows the behavior of a carrier when photoexcitation occurs in the data line side junction region (that is, the drain side junction region) in the case where the data line side source/drain region is applied with a drain electric potential. FIG. 13 is a conceptional diagram that shows the behavior of a carrier when photoexcitation occurs in the pixel electrode side junction region (in other words, the drain side junction region) in the case where the pixel electrode side source/drain region is applied with a drain electric potential.

Hereinafter, the case where electric charge is held at a pixel portion that includes a pixel switching TFT and photoexcitation has occurred will be considered. This differs from the case where the above described TEG is assumed in that the pixel electrode side of the pixel switching TFT may be made into a floating state. A holding capacitor, such as the storage capacitor 70, may be connected to the pixel electrode side of the pixel switching TFT. When the capacitance of the holding capacitor is sufficiently large, the pixel electrode side is made into a state similar to a fixed electrode as in the case that uses the above described TEG. However, when the capacitance of the holding capacitor is not sufficiently large, the pixel electrode side is made into a floating state or a state closer to the floating state. Note that, here, it is assumed that the above capacitance is not sufficiently large.

In FIG. 12 and FIG. 13, alternating current drive is employed in the liquid crystal device in order to prevent a so-called burn-in. Here, by assuming display of a middle gray scale, it is assumed when the pixel electrode is alternately held with an electric charge of 4.5 V negative field and an electric charge of 9.5 V positive field using 7 V as a reference electric potential. Therefore, the source and drain of the pixel switching TFT are not fixed but exchanged between the pixel electrode side source/drain region and the data line side source/drain region. That is, as shown in FIG. 12, when the electric charge of negative field is held by the pixel electrode (that is, when the electric potential of the pixel electrode side source/drain region is lower than the electric potential of the data line side source/drain region), the pixel electrode side source/drain region becomes a source. In contrast, as shown in FIG. 13, when the electric charge of positive field is held by the pixel electrode (that is, when the electric potential of the pixel electrode side source/drain region is higher than the electric potential of the data line side source/drain region), the pixel electrode side source/drain region becomes a drain.

In FIG. 12, when the electric charge of negative field is held by the pixel electrode, the pixel electrode side source/drain region becomes a source (or an emitter) and the data line side source/drain region becomes a drain (or a collector). When photoexcitation occurs in the data line side junction region, which is the drain side junction region, as described above, the first current component based on movement of electrons generated by the photoexcitation and the second current component due to the bipolar effect are generated. Here, when the second current component is generated on the basis of the bipolar effect (that is, the base potential is reduced from the potential Lc1 to the potential Lc2, and electrons move from the pixel electrode side source/drain region, which serves as a source, to the data line side source/drain region, which serves as a drain), electrons are taken out from the pixel electrode side source/drain region, which is in a floating state. Thus, the potential of the pixel electrode side source/drain region, which serves as an emitter, is reduced from the potential Ls1 to the potential Ls2 (the electric potential increases). That is, when photoexcitation occurs in the data line side junction region, which is the drain side junction region, the base potential decreases and the potential of the pixel electrode side source/drain region, which serves as an emitter, decreases. In other words, when photoexcitation occurs in the data line side junction region, which is the drain side junction region, the emitter electric potential increases as the base electric potential increases. For this reason, the drain current (that is, collector current) is suppressed.

On the other hand, in FIG. 13, when the electric charge of positive field is held by the pixel electrode, the data line side source/drain region becomes a source (or an emitter), and the pixel electrode side source/drain region becomes a drain (or a collector). When photoexcitation occurs in the pixel electrode side junction region, which is the drain side junction region, as described above, the first current component based on movement of electrons generated by the photoexcitation and the second current component due to the bipolar effect are generated. Here, because the data line side source/drain region, which serves as a source, is connected to the data line, the data line side source/drain region is not made into a floating state, unlike the pixel electrode, and the electric potential thereof does not change. Here, when the second current component is generated on the basis of the bipolar effect (that is, the base potential is reduced from the potential Lc1 to the potential Lc2, and electrons move from the data line side source/drain region, which serves as a source, to the pixel electrode side source/drain region, which serves as a drain), electrons flow to the pixel electrode side source/drain region, which is in a floating state. Thus, the potential of the pixel electrode side source/drain region, which serves as a collector, is increased from the potential Ld1 to the potential Ld2 (the electric potential decreases). However, the increase in potential of the pixel electrode side source/drain region, which serves as a collector, unlike the decrease in potential of the pixel electrode side source/drain region, which serves as a source as described above, hardly functions to suppress the drain current. The drain current (that is, collector current) is determined mainly on the basis of the magnitude of base electric potential relative to the emitter electric potential, so that a decrease in collector electric potential hardly suppresses the drain current, that is, the bipolar transistor enters a saturation region.

As described with reference to FIG. 12 and FIG. 13, when the electric charge of positive field is held by the pixel electrode (that is, when the pixel electrode side source/drain region becomes a drain), the second current component due to the bipolar effect is hardly suppressed; in contrast, when the electric charge of negative field is held by the pixel electrode (that is, when the data line side source/drain region becomes a drain), the second current component due to the bipolar effect is suppressed because of the increase in electric potential of the pixel electrode side source/drain region, which is in a floating state. That is, the drain current increases on the basis of light leakage current when the pixel electrode side source/drain region becomes a drain than when the data line side source/drain region becomes a drain.

Figure 14:
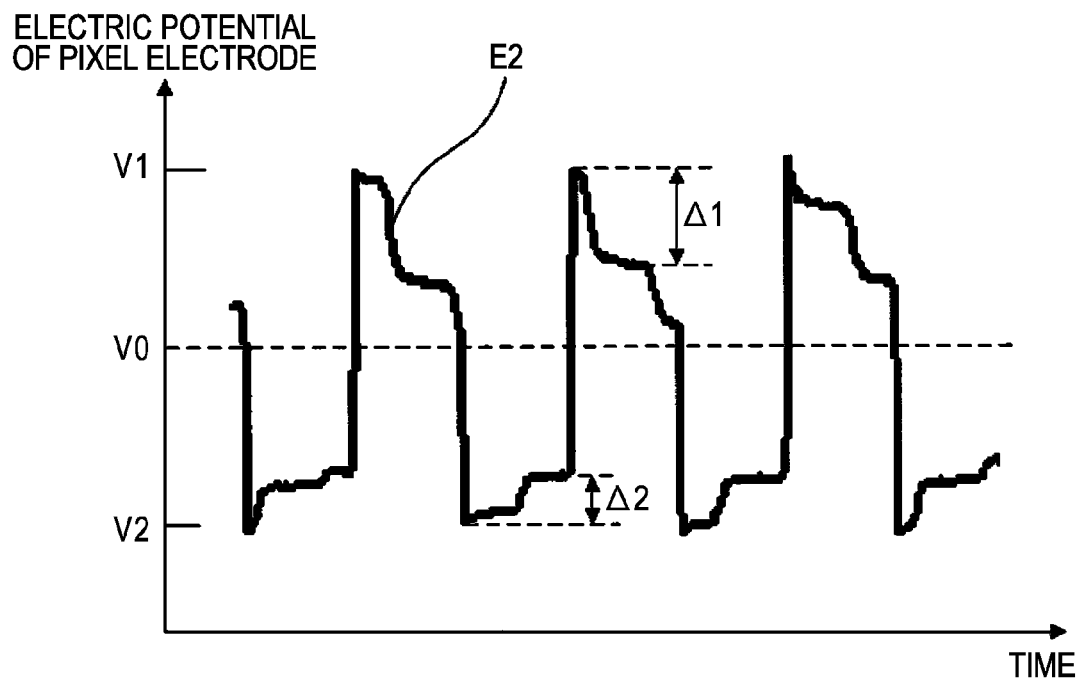
FIG. 14 is a view that shows a waveform of a pixel electrode electric potential when relatively intensive light is irradiated to the overall pixel switching TFT.

Here, FIG. 14 is a view that shows a waveform of a pixel electrode electric potential when relatively intensive light is irradiated to the overall pixel switching TFT.

In FIG. 14, data E2 indicate that the variation Δ1 in pixel electrode electric potential when the electric charge of positive field is held by the pixel electrode (when the pixel electrode electric potential is an electric potential V1) is larger than the variation Δ2 in pixel electrode electric potential when the electric charge of negative field is held by the pixel electrode (when the pixel electrode electric potential is an electric potential V2). That is, the data E2 indicate that the electric charge of positive field is held poorer in the pixel electrode than the electric charge of negative field (that is, light leakage is likely to occur). This coincides with the above described mechanism in which light leakage current tends to occur when the electric charge of positive field is held by the pixel electrode (that is, when the pixel electrode side source/drain region becomes a drain) than when the electric charge of negative field is held by the pixel electrode (that is, when the data line side source/drain region becomes a drain).

As described above in detail with reference to FIG. 9 to FIG. 14, the drain current is likely to increase when photoexcitation occurs in the drain side junction region of the pixel switching TFT. Furthermore, the drain current is likely to increase when the pixel electrode side source/drain region becomes a drain (conversely, when the data line side source/drain region becomes a drain, the current component due to the bipolar effect is suppressed). Thus, as in the case of the liquid crystal device according to the present embodiment, by enhancing a light shielding property to the pixel electrode side LDD region 1c, which is the pixel electrode side junction region, higher than a light shielding property to the data line side LDD region 1b, which is the data line side junction region, it is possible to highly effectively reduce light leakage current in the TFT 30 while maintaining a high aperture ratio.

Method of Manufacturing Electro-Optical Device

Hereinafter, a manufacturing process of the liquid crystal device according to the above described present embodiment will be described with reference to FIG. 15A to FIG. 19B. FIG. 15A to FIG. 15C, FIG. 16A to FIG. 16C, FIG. 18A and FIG. 18B, FIG. 19A and FIG. 19B are process drawings that sequentially show a configuration of a portion in cross section, shown in FIG. 6, in each process of the manufacturing process. FIG. 17 is a cross-sectional view that shows a configuration of a portion in cross section, shown in FIG. 8, in a process in which an opening portion is formed.

Note that, in the following description, processes of manufacturing the data line 6a, the scanning line 11a, the TFT 30, the storage capacitor 70, and the like, which are formed in each pixel portion on the TFT array substrate 10, will be specifically described in detail, and a description of processes of manufacturing the alignment layer 22, the opposite electrode 21, or the like, formed on the opposite substrate 20 is omitted.

Figure 15A:
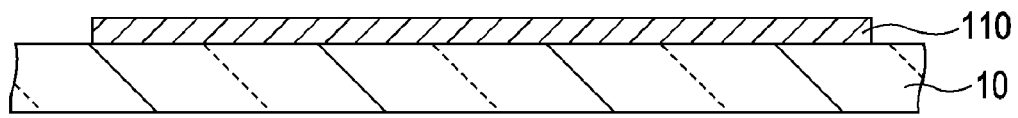
FIG. 15A to FIG. 15C are process drawings (Part I) that sequentially show a configuration of a portion in cross section, shown in FIG. 6, in each process of a manufacturing process.
Figure 15B:
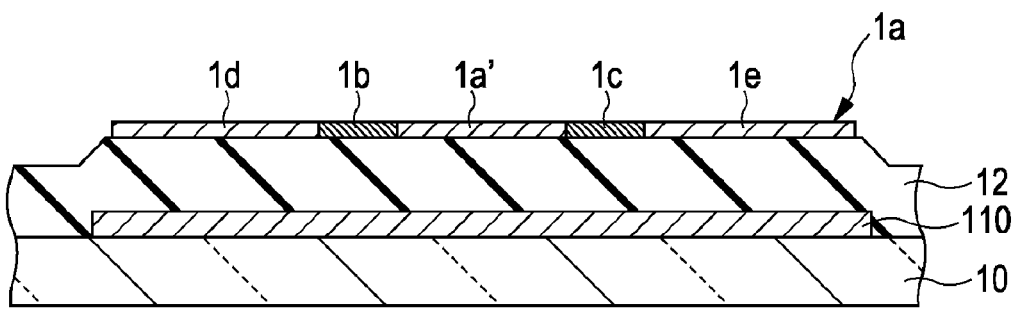
Figure 16A:
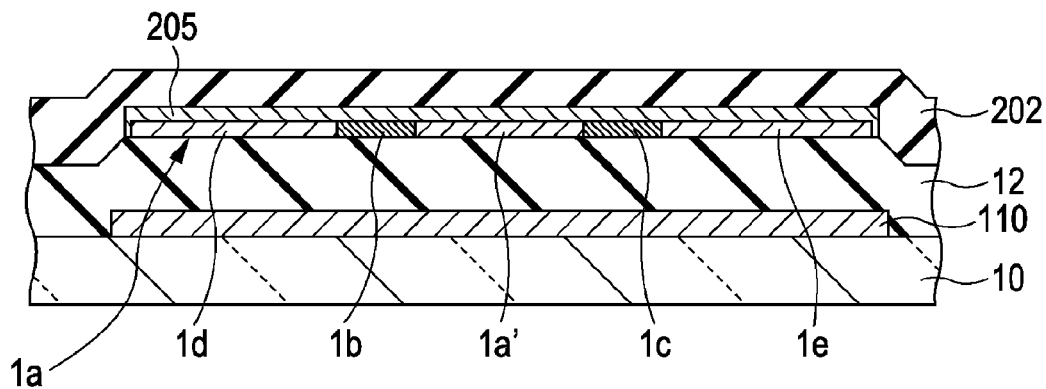
FIG. 16A to FIG. 16C are process drawings (Part II) that sequentially show a configuration of a portion in cross section, shown in FIG. 6, in each process of a manufacturing process.

First, in the process shown in FIG. 15A, the lower side light shielding film 110 is formed over the entire surface of the TFT array substrate 10, and, after that, in the process shown in FIG. 15B, the base insulating film 12 is formed on the lower side light shielding film 110.

Subsequently, an amorphous silicon film is formed on the base insulating film 12 by means of low pressure CVD, or the like, and heat treatment is then performed on the amorphous silicon film. Thus, a polysilicon film is grown in solid phase. Alternatively, without using an amorphous silicon film, a polysilicon film is directly formed by means of low pressure CVD, or the like. Next, the semiconductor layer 1a is formed on the polysilicon film by performing, for example, photolithography method and etching process. Thereafter, by doping impurity ion in two stages, that is, lightly doping and densely doping, the semiconductor layer 1a of an LDD structure pixel switching TFT 30 is formed to include the data line side LDD region 1b, the pixel electrode side LDD region 1c, the data line side source/drain region 1d and the pixel electrode side source/drain region 1e.

Figure 15C:
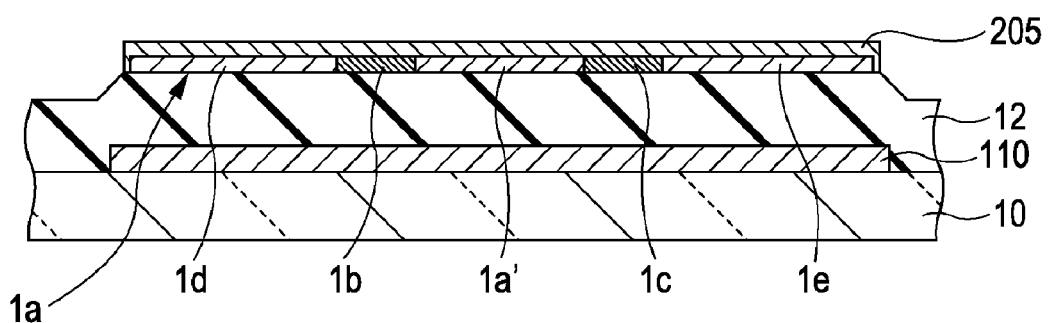

After that, in the process shown in FIG. 15C, the protection film 205 is formed on the semiconductor layer 1a so as to cover at least the channel region 1a' of the semiconductor layer 1a. The protection film 205 is partly removed from a portion thereof on the semiconductor layer 1a, which will be described later, and is formed of a material, such as silicon nitride (SiN), for example, having a greater etching rate than the semiconductor layer 1a by a second etchant in etching process.

Subsequently, in the process shown in FIG. 16A, the insulating film 202 is formed in an upper layer than the protection film 205. The insulating film 202 is formed of a material, such as silicon oxide (SiO2), for example, having a greater etching rate than the protection film 205 by a first etchant in etching process in the process of forming the opening portion 202h.

Figure 16B:
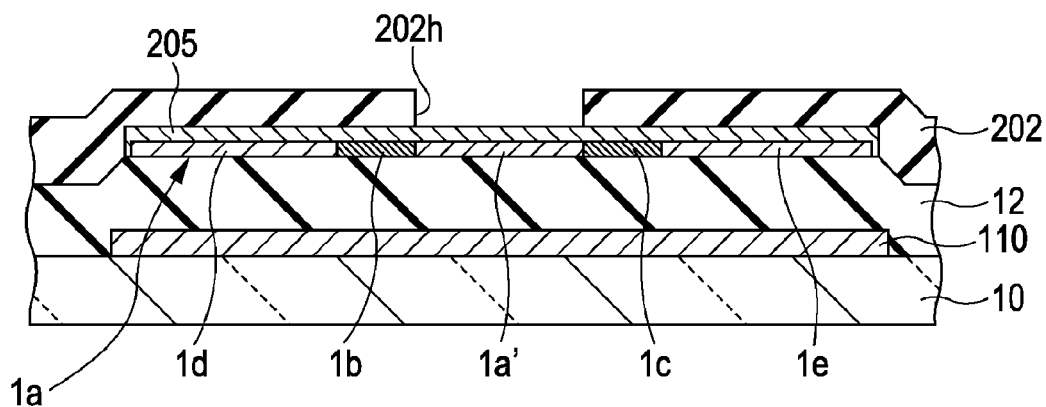
Figure 17:
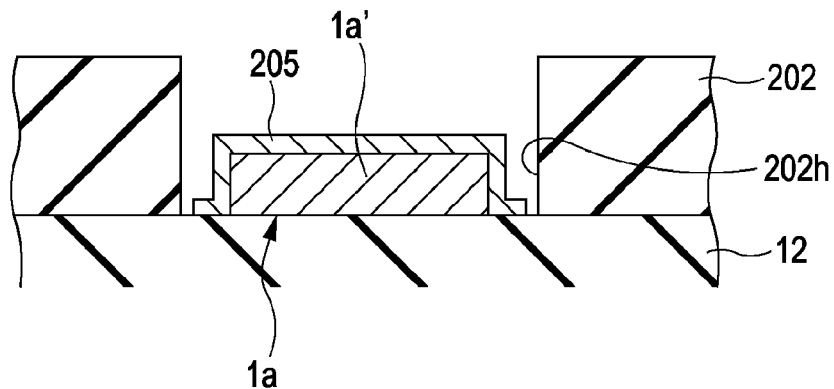
FIG. 17 is a cross-sectional view that shows a configuration of a portion in cross section, shown in FIG. 8, in a process in which an opening portion is formed.

Then, in the process shown in FIG. 16B, the opening portion 202h is opened by performing, together with, for example, photolithography method, dry etching method that uses a fluorine-based etching gas as the first etchant, wet etching method that uses hydrofluoric-based chemicals as the first etchant, or both the dry etching method and the wet etching method on the insulating film 202, for example.

Here, the semiconductor layer 1a is formed of a material having a greater etching rate by the second etchant than by the first etchant.

Thus, when the opening portion 202h is opened, if the protection film 205 is not formed on the channel region 1a', in the etching process using the first etchant, there is a possibility that the selection ratios of the insulating film 202 and the semiconductor layer 1a are reduced and, after the opening portion 202h has been opened, the surface of the semiconductor layer 1a exposed to the inside of the opening portion 202h is subjected to the first etchant, and, as a result, the channel region 1a' of the semiconductor layer 1a is etched. In addition, there is a possibility that, after the opening portion 202h has been opened, the semiconductor layer 1a is damaged by the second etchant and, as a result, the quality of the layer is degraded.

Therefore, particularly in the present embodiment, in a state where at least the channel region 1a' of the semiconductor layer 1a is covered with the protection film 205, the opening portion 202h is opened using the first etchant. Here, the insulating film 202, the protection film 205 and the semiconductor layer 1a each are formed of a material that has a smaller over etching amount of the semiconductor layer 1a in the etching process of the protection film 205 using the second etchant than an over etching amount of the semiconductor layer 1a in the etching process of the insulating film 202 using the first etchant. In addition, the protection film 205 and the insulating film 202 each are formed of a material having a greater etching rate to the insulating film 202 by the first etchant than an etching rate to the protection film 205 by the first etchant.

Thus, in the etching process using the first etchant, it is possible to increase the selection ratios of the protection film 205 and the insulating film 202. Moreover, by adjusting the thickness of the film, in addition to forming the protection film 205 of the above described material, it is possible to further effectively increase the selection ratios. Thus, after the opening portion 202h has been opened, even when the surface is subjected to the first etchant in the opening portion 202h, it is possible to prevent the channel region 1a' of the semiconductor layer 1a from being damaged because of removal of the protection film 205 from the opening portion 202h by etching.

Here, as shown in FIG. 17, when wet etching method is used, there is a possibility that, because of over etching, the diameter of the opening portion 202h may become greater than an originally desired diameter, that is, a designed value such that the opening portion 202h does not reach a region other than the channel region 1a'. Thus, even when the diameter of the opening portion 202h is increased, it is preferable that conditions of the etching process are controlled so that the opening portion 202h does not extend to overlap a region other than the channel region 1a' in the Y direction indicated in FIG. 4 or FIG. 5.

Figure 16C:
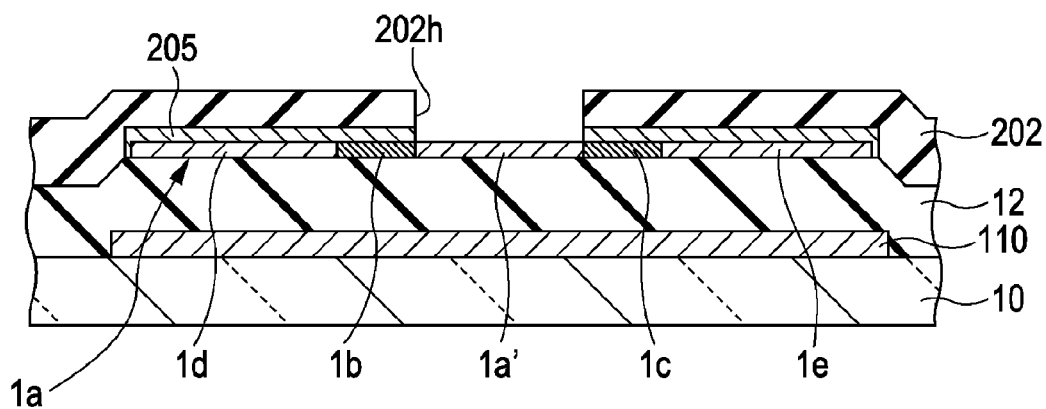

After that, in the process shown in FIG. 16C, by performing, for example, wet etching method using hot phosphoric acid as the second etchant, together with photolithography method, for example, the protection film 205 is removed from the opening portion 202h. Note that, as the etching process, in addition to or in place of wet etching method, dry etching method may be performed.

Then, because the etching rate to the semiconductor layer 1a using the second etchant is smaller than the etching rate to the protection film 205 using the second etchant, in the etching process using the second etchant, it is possible to increase the selection ratios of the semiconductor layer 1a and the protection film 205. Thus, in the opening portion 202h, the channel region 1a' of the semiconductor layer 1a is prevented from being subjected to the second etchant and then damaged, so that it is possible to easily and reliably remove the protection film 205.

Figure 18A:
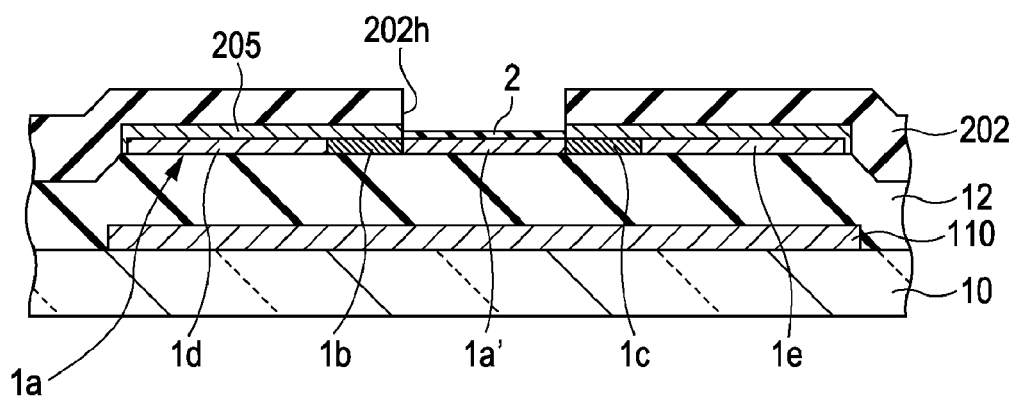
FIG. 18A and FIG. 18B are process drawings (Part III) that sequentially show a configuration of a portion in cross section, shown in FIG. 6, in each process of a manufacturing process.
Figure 18B:
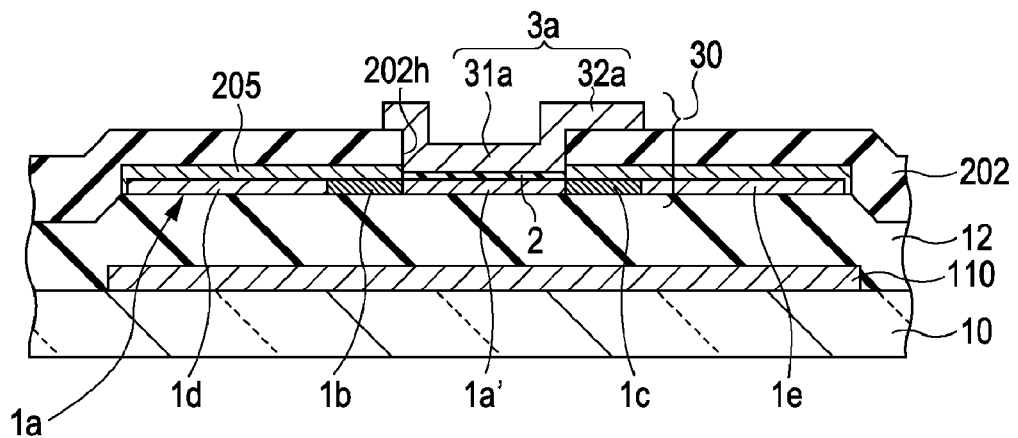

Thereafter, in the process shown in FIG. 18A, after the gate insulating film 2 has been formed on the channel region 1a' of the semiconductor layer 1a that is exposed to the inside of the opening portion 202h, in the process shown in FIG. 18B, the gate electrode 3a is continuously formed from the opening portion 202h onto the insulating film 202. In this manner, the body portion 31a is formed in the opening portion 202h and the elongated portion 32a extends continuously from the body portion 31a onto the insulating film 202. Thus, the TFT 30 is formed, and the scanning line 11a is also formed integrally with the elongated portion 32a. Hence, the elongated portion 32a and the scanning line 11a can be formed in the same process with the same film at the same time, so that it is possible to further simplify the manufacturing process of the liquid crystal device.

Figure 19A:
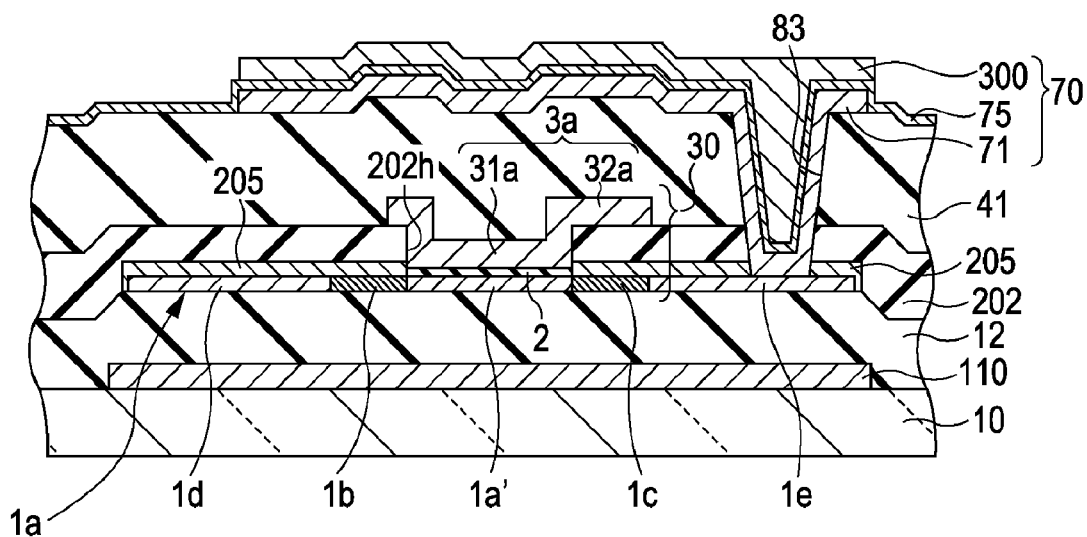
FIG. 19A and FIG. 19B are process drawings (Part IV) that sequentially show a configuration of a portion in cross section, shown in FIG. 6, in each process of a manufacturing process.

After that, in the process shown in FIG. 19A, after the interlayer insulating film 41 has been formed, the storage capacitor 70 is formed. Subsequently, in the process shown in FIG. 19B, after the interlayer insulating film 42 has been formed, the data line 6a and the relay layer 93 are formed.

Figure 19B:
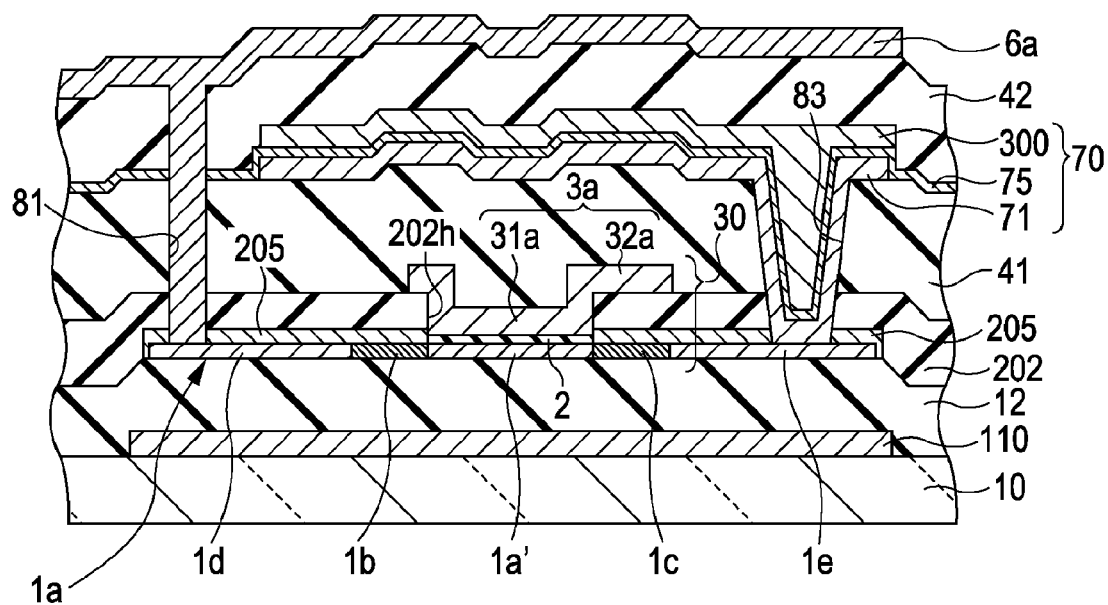

In the process shown in FIG. 19A and in the process shown in FIG. 19B, the contact holes 83, 81 and 84 are respectively formed. Particularly, the contact hole 81 that electrically connects the data line 6a to the data line side source/drain region 1d and the contact hole 83 that electrically connects the pixel electrode side source/drain region 1e to the lower capacitor electrode 71, which relays electrical connection between the pixel electrode 9a and the pixel electrode side source/drain region 1e, each extend through the insulating film 202 to the surface of the semiconductor layer 1a.

Here, when the protection film 205 is formed so as to cover at least one of the data line side source/drain region 1d and the pixel electrode side source/drain region 1e, outside the channel region 1a', it is possible to open the contact hole 81 or 83 through the same manufacturing process as those of opening of the opening portion 202h and removal of the protection film 205 from the opening portion 202h.

Thus, when the contact hole 81 or 83 is opened in the insulating film 202 in addition to the opening portion 202h, it is possible to increase the selection ratio of the etching process to the insulating film 202 as in the case when the opening portion 202h is opened. In addition, after that, when the protection film 205 is removed from the contact hole 81 or 83 as well, it is possible to increase the selection ratio of the etching process as in the case when the protection film 205 is removed from the opening portion 202h.

Moreover, it is possible to open the contact hole 81 or 83 using the same manufacturing device as that used to open the opening portion 202h, so that it is advantageous in that the manufacturing process may be simplified and the manufacturing costs may be reduced.

After the process shown in FIG. 19B, the interlayer insulating film 43 is formed and, after the contact hole 85 has been opened, the pixel electrode 9a is formed.

Thus, according to the manufacturing process of the liquid crystal device as described above, when the TFT 30 is formed, it is possible to prevent troubles, such as a decrease in yield due to the damaged semiconductor layer 1a, degradation in display quality due to malfunction of the TFT 30, or a decrease in reliability. In addition, because the protection film 205 may be easily removed, it is possible to prevent the manufacturing process from becoming complicated.

Electronic Apparatus

Figure 20:
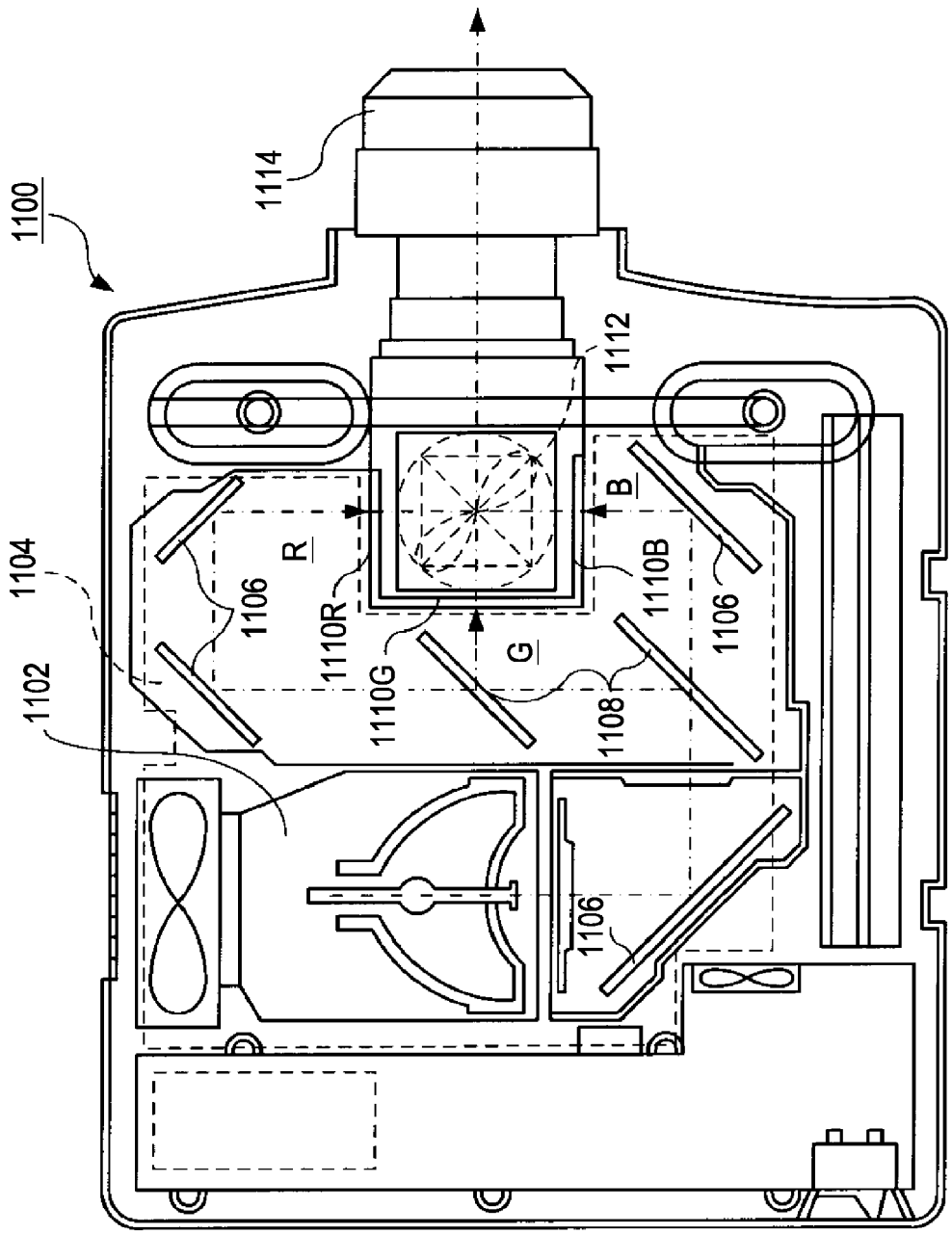
FIG. 20 is a plan view that shows a configuration of a projector, which is one example of an electronic apparatus to which the electro-optical device is applied.

Next, the case where the liquid crystal device, which is the above described electro-optical device, is applied to various electronic apparatuses will be described. Here, FIG. 20 is a plan view that shows a configuration example of a projector. Hereinafter, a projector that uses the liquid crystal device as a light valve will be described.

As shown in FIG. 20, a projector 1100 installs therein a lamp unit 1102 formed of a white light source, such as a halogen lamp. Light projected from the lamp unit 1102 is split into three primary colors, that is, RGB, by four mirrors 1106 and two dichroic mirrors 1108, which are arranged in a light guide 1104 and then enter liquid crystal panels 1110R, 1110B and 1110G, which are light valves corresponding to the primary colors.

The configurations of the liquid crystal panels 1110R, 1110B and 1110G are equivalent to the above described liquid crystal device, and are respectively driven by primary color signals of R, G, B, which are supplied from an image signal processing circuit. Then, light modulated by these liquid crystal panels enters a dichroic prism 1112 from the three directions. In this dichroic prism 1112, R light and B light are refracted at a right angle while, on the other hand, G light goes straight. Thus, by composing images corresponding to the respective colors, a color image is projected onto a screen, or the like, through a projection lens 1114.

Here, focusing on display images by the liquid crystal panels 1110R, 1110B and 1110G, the display image by the liquid crystal panel 1110G needs to be mirror reversed relative to the display images of the liquid crystal panels 1110R, 1110B.

Note that, because rays of light corresponding to the primary colors of R, G, B enter the liquid crystal panels 1110R, 1110B and 1110G by the dichroic mirrors 1108, no color filter needs to be provided.

Note that, in addition to the electronic apparatus described with reference to FIG. 20, the electronic apparatus may include a mobile personal computer, a cellular phone, a liquid crystal television, a viewfinder type or a direct view type video tape recorder, a car navigation system, a pager, a personal organizer, an electronic calculator, a word processor, a workstation, a video telephone, a point-of-sales terminal, and devices provided with a touch panel. Then, of course, the aspects of the invention may be applied to the above various electronic apparatuses.

In addition, the aspects of the invention may be applied to a reflective liquid crystal device (LCOS), a plasma display (PDP), a field emission display (FED, SED), an organic EL display, a digital micromirror device (DMD), an electrophoretic device, or the like, in addition to the liquid crystal device described in the above embodiments.

The invention is not limited to the above described embodiments, and may be modified into various forms without departing from the spirit and scope of the invention as described in the appended claims and specification. The scope of the invention also encompasses the thus modified electro-optical device substrate, a method of manufacturing the same, an electro-optical device that is provided with the electro-optical device substrate, and an electronic apparatus provided with the electro-optical device.

What is claimed is:

1. An electro-optical device substrate comprising:
    a substrate,
    data lines over the substrate;
    scanning lines over the substrate, the scanning lines intersecting the data lines;
    pixel electrodes that are provided in pixels at positions corresponding to intersections of the data lines and the scanning lines; and
    transistors each including:
        a semiconductor layer located in a first region that extends along a first direction within a non-aperture region that separates aperture regions of the pixels, the semiconductor layer including
            a channel region having a channel length in the first direction;
            a data line side source/drain region electrically connected to a corresponding one of the data lines;
            a pixel electrode side source/drain region electrically connected to a corresponding one of the pixel electrodes;
            a first junction region between the channel region and the data line side source/drain region; and
            a second junction region between the channel region and the pixel electrode side source/drain region;
        a gate insulation layer; and
        a gate electrode including:
            a body portion opposed to the channel region through the gate insulating film; and an elongated portion that extends from the body portion so as to cover the second junction region; and an insulating film over the semiconductor layer, the insulating film having an opening portion that overlaps the channel region, the body portion of the gate electrode being arranged in the opening portion of the insulating film and the elongated portion of the gate electrode portion extending onto the insulating film so as to cover the second junction portion, wherein the second junction region is located in an intersection region of the non-aperture region, the intersection region being where the first region intersects a second region within the non-aperture region, the second region extending extends in a second direction that intersects with the first direction.

2. The electro-optical device substrate according to claim 1, wherein at least a portion of the channel region is arranged in the first region outside the intersection region.

3. The electro-optical device substrate according to claim 1, wherein each of the scanning lines is integrally formed with the corresponding elongated portion with the same film in the same layer.

4. The electro-optical device substrate according to claim 1, wherein each of the elongated portions is formed in the intersection region so as to overlap the corresponding data line.

5. The electro-optical device substrate according to claim 1, further comprising:

a protection film that is provided in an upper layer than the semiconductor layer and in a lower layer than the insulating film, wherein, after the protection film is formed to protect the channel region from an etching process that is performed when the opening portion is opened in the insulating film, a portion of the protection film, which is located in the opening portion, is removed and then formed around the opening portion.

6. An electro-optical device comprising the electro-optical device substrate according to claim 1.

7. An electronic apparatus comprising the electro-optical device according to claim 6.

8. A method of manufacturing an electro-optical device substrate, comprising:

forming a semiconductor layer that includes a channel region, a data line side source/drain region, a pixel electrode side source/drain region, a first junction region, and a second junction region, the channel region having a channel length along a first direction in a first region extending along the first direction in a non-aperture region that separates aperture regions of pixels that are defined at positions corresponding to intersections of data lines and scanning lines, the data line side source/drain region being electrically connected to a corresponding one of the data lines, the pixel electrode side source/drain region being electrically connected to a pixel electrode, the first junction region being formed between the channel region and the data line side source/drain region, and the second junction region being formed between the channel region and the pixel electrode side source/drain region at an intersection region of the non-aperture region, the intersection region being where the first region intersects a second region within the non-aperture region, the second region extending in a second a second direction that intersects with the first direction forming a protection film so as to cover the channel region;

forming an insulating film so as to cover the semiconductor layer after the protection film has been formed;

opening an opening portion to expose the protection film at a portion of the insulating film that overlaps the channel region by performing etching using a first etchant;

exposing the channel region by performing etching on the protection film exposed through the opening portion using a second etchant that is different from the first etchant;

forming a gate insulating film on the exposed channel region in the opening portion; and forming a transistor by forming a gate electrode that includes a body portion that is disposed in the opening portion of the gate insulating film and an elongated portion that extends from the body portion onto the insulating film so as to cover the second junction region, wherein:

an etching rate to the insulating film by the first etchant is greater than an etching rate to the protection film by the first etchant, an etching rate to the protection film by the second etchant is greater than an etching rate to the semiconductor layer by the second etchant, and an etching rate to the semiconductor layer by the first etchant is greater than the etching rate to the semiconductor layer by the second etchant.

9. The method of manufacturing the electro-optical device substrate according to claim 8, wherein the semiconductor layer is formed using silicon when the semiconductor layer is formed, wherein the protection film is formed using silicon nitride film when the protection film is formed, and wherein the insulating film is formed using silicon oxide film when the insulating film is formed.

10. The method of manufacturing the electro-optical device substrate according to claim 8, further comprising:

forming each of the scanning lines so as to be electrically connected to the corresponding gate electrode;

forming each of the data lines so as to intersect with the scanning lines and to be electrically connected to the corresponding data line side source/drain region; and forming each of the pixel electrodes in the corresponding pixel so as to be electrically connected to the corresponding pixel electrode side source/drain region, wherein at least one of the data lines and the pixel electrodes are formed in an upper layer than the transistors by at least one of forming the data lines and forming the pixel electrodes.

* * * * *